United States Patent
Lin et al.

(10) Patent No.: US 11,856,787 B2
(45) Date of Patent: Dec. 26, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Meng-Han Lin, Hsinchu (TW); Sai-Hooi Yeong, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 107 days.

(21) Appl. No.: 17/463,726

(22) Filed: Sep. 1, 2021

(65) Prior Publication Data
US 2023/0063934 A1    Mar. 2, 2023

Related U.S. Application Data

(60) Provisional application No. 63/209,462, filed on Jun. 11, 2021.

(51) Int. Cl.
| | | |
|---|---|---|
| *H01L 21/00* | (2006.01) | |
| *H10B 51/40* | (2023.01) | |
| *H10B 51/30* | (2023.01) | |
| *H01L 21/8234* | (2006.01) | |
| *H01L 23/522* | (2006.01) | |

(52) U.S. Cl.
CPC ..... *H10B 51/40* (2023.02); *H01L 21/823475* (2013.01); *H01L 23/5226* (2013.01); *H10B 51/30* (2023.02)

(58) Field of Classification Search
CPC . H10B 51/40; H10B 51/30; H01L 21/823475; H01L 23/5226
See application file for complete search history.

(56) References Cited

U.S. PATENT DOCUMENTS

| | | | |
|---|---|---|---|
| 6,559,497 B2 * | 5/2003 | Shih | H01L 28/75 |
| | | | 257/295 |
| 8,996,838 B1 | 3/2015 | D'Abreu et al. | |
| 9,337,210 B2 | 5/2016 | Karda et al. | |
| 10,762,960 B2 * | 9/2020 | Chih | G11C 13/0026 |
| 2019/0288183 A1 | 9/2019 | Kanaya | |
| 2020/0083288 A1 | 3/2020 | Kanaya | |

FOREIGN PATENT DOCUMENTS

| | | |
|---|---|---|
| JP | 2016529717 A | 9/2016 |
| TW | 201606496 A | 2/2016 |
| TW | I699758 B | 7/2020 |
| TW | I721795 B | 3/2021 |

* cited by examiner

*Primary Examiner* — Richard A Booth
(74) *Attorney, Agent, or Firm* — Slater Matsil, LLP

(57) ABSTRACT

Semiconductor devices and methods of manufacture are provided wherein a ferroelectric random access memory array is formed with bit line drivers and source line drivers formed below the ferroelectric random access memory array. A through via is formed using the same processes as the processes used to form individual memory cells within the ferroelectric random access memory array.

20 Claims, 29 Drawing Sheets

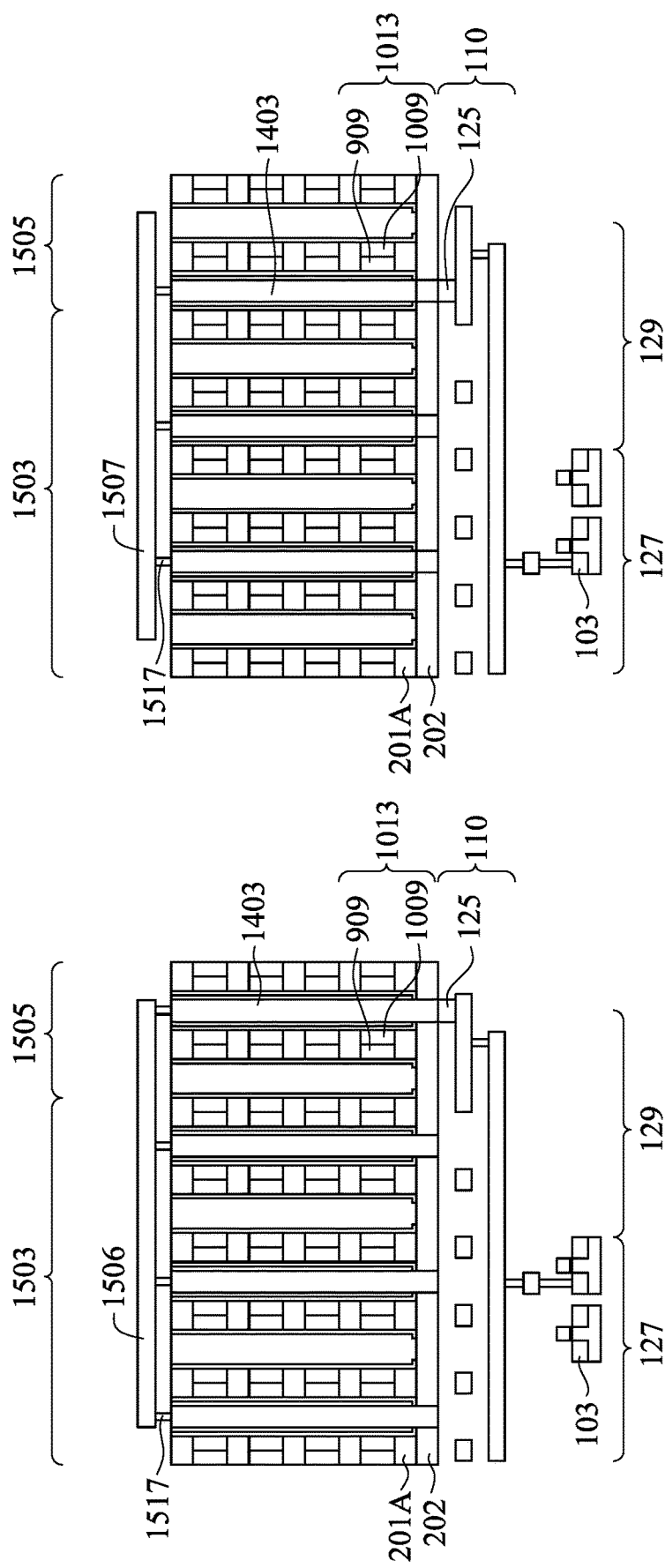

SEMICONDUCTOR DEVICE AND METHOD OF MANUFACTURE

PRIORITY CLAIM AND CROSS-REFERENCE

This application claims the benefit of U.S. Provisional Application No. 63/209,462, filed on Jun. 11, 2021, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15A-15G illustrate formation of an interconnect structure, in accordance with some embodiments.

DETAILED DESCRIPTION

Figure 1A:
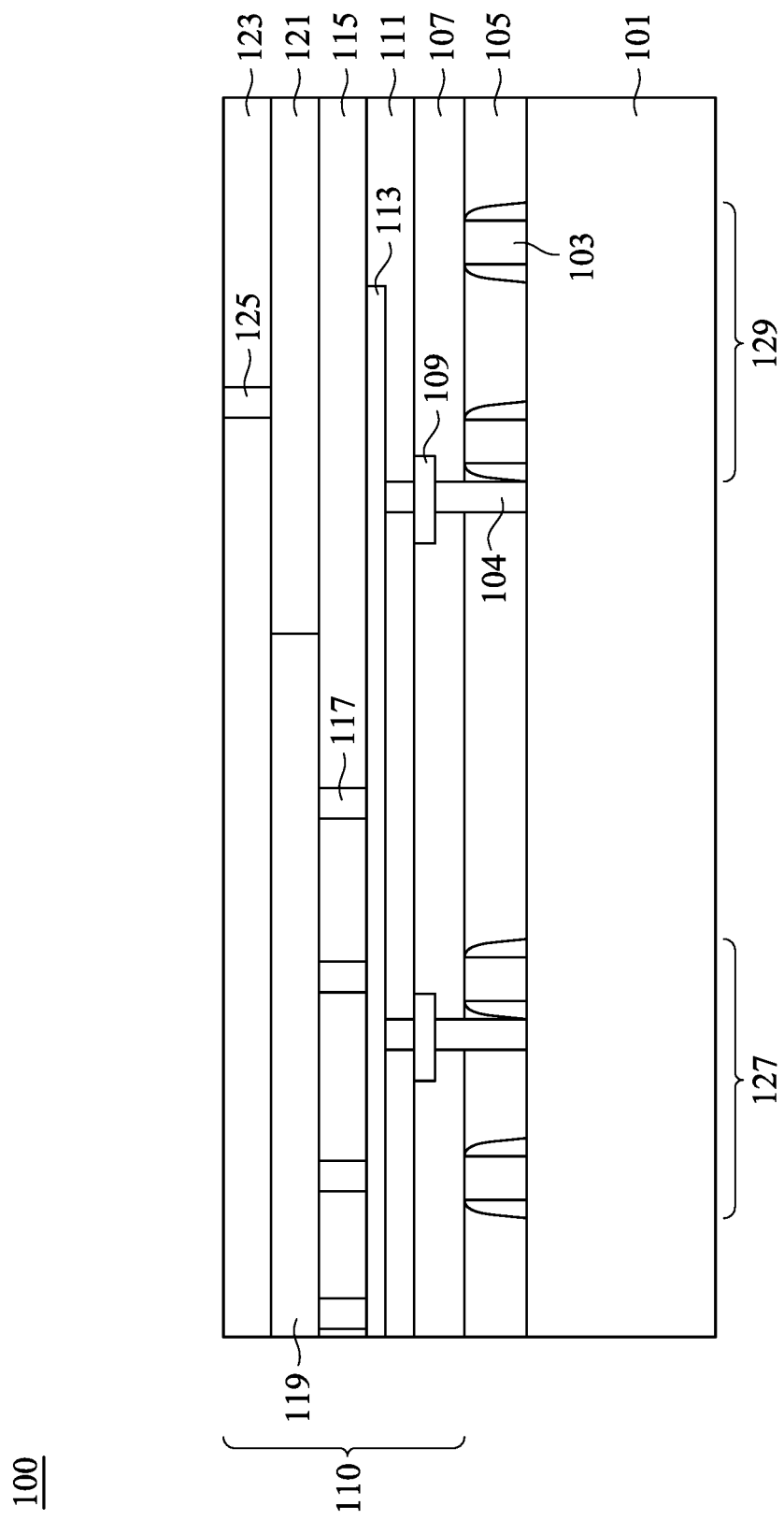
FIGS. 1A-1B illustrate formation of active devices and metallization layers over a substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments in which drivers are connected to 3DFeRAM memory cells using a CMOS under area (CuA) design. The embodiments described herein, however, are not intended to be limited to the precise descriptions included, as the ideas may be implemented in a wide array of embodiments. All such embodiments are fully intended to be included within the scope of the current description.

Figure 1B:
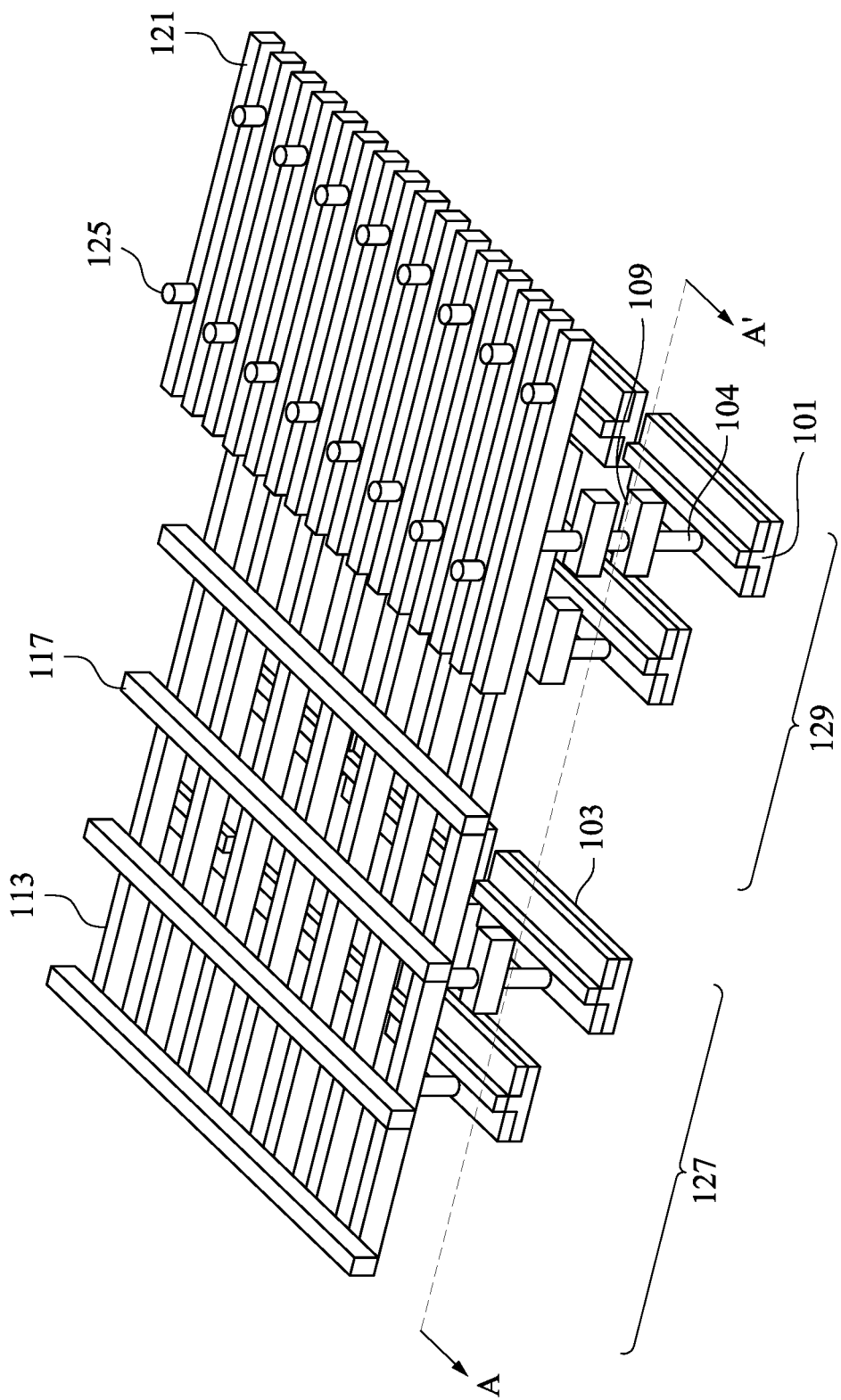

Turning now to FIGS. 1A-1B, there is illustrated a portion of a semiconductor device 100 including a semiconductor substrate 101, active devices 103, an interlayer dielectric (ILD) 105, and metallization layers 110 which comprise at least a first dielectric layer 107, and a first metal layer 109 (M1) within the first dielectric layer 107. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multilayered substrates, gradient substrates, or hybrid orientation substrates.

The semiconductor substrate 101 may include the active devices 103. As one of ordinary skill in the art will recognize, a wide variety of active devices and passive devices such as transistors, capacitors, resistors, combinations of these, and the like may be used to generate the desired structural and functional requirements of the design for the semiconductor device 100. The active devices 103 may be planar, fin field effect transistors, nanostructure field effect transistors, combinations of these, or the like, and may be formed using any suitable methods.

In a particular embodiment, source/drain regions are formed in the semiconductor substrate 101 on opposing sides of a gate dielectric with a gate electrode formed over the gate dielectric. In an embodiment in which the semiconductor substrate 101 is an n-type substrate, the source/drain regions are formed by implanting appropriate p-type dopants such as boron, gallium, indium, or the like. Alternatively, in an embodiment in which the semiconductor substrate is a p-type substrate, the source/drain regions may be formed by implanting appropriate n-type dopants such as phosphorous, arsenic, or the like. These source/drain regions are implanted using the gate dielectric and gate electrode as masks.

Further, the active devices 103 may be grouped and/or connected together in order to form functional circuitry. In a particular embodiment, the active devices 103 in a bit line driver region 127 may be manufactured to form a bit line driver, while the active devices 103 in a source line driver region 129 may be manufactured to from a word line driver. However, any suitable combination of connections to form any suitable functional circuitry may be utilized.

The ILD layer 105 is formed over the active devices 103 in order to protect and isolate the active devices 103. In an embodiment the ILD layer 105 may comprise a material such as boron phosphorous silicate glass (BPSG), although any suitable dielectrics may be used for either layer. The ILD layer 105 may be formed using a process such as PECVD, although other processes, such as LPCVD, may alternatively be used. The ILD layer 105 may be formed to a thickness of between about 100 Å and about 3,000 Å.

Once the ILD layer 105 has been formed, contact plugs 104 may be formed through the ILD layer 105 to electrically connect the active devices 103. In an embodiment the formation of the contact plugs 104 may be initiated by first forming contact plug openings through the ILD layer 105 to expose either the source/drain regions or else the gate electrodes of the active devices 103, the openings are filled with a conductive material, and then the conductive material is planarized using a process such as chemical mechanical polishing. However, any suitable method of forming the contact plugs 104 may be utilized.

The first dielectric layer 107 may be formed over the ILD layer 105. The first dielectric layer 107 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 107 may be formed through a process such as a spin-on process or a chemical vapor deposition (CVD), although any suitable process may be utilized, and may have a first thickness $T_1$ of between about 400 Å and about 1000 Å, such as about 600 Å.

FIG. 1A additionally illustrates a formation of the first metal layer 109 within the first dielectric layer 107. In an embodiment the first metal layer 109 may be formed using, e.g., a dual damascene process, whereby an opening for a trench and via are first formed within the first dielectric layer 107. In an embodiment the opening may be formed using one or more photolithographic masking and etching processes. Once formed, the opening may be filled and/or overfilled with conductive material, and then planarized. However, any suitable method may be utilized.

A second dielectric layer 111 may be formed over the first dielectric layer 107. In an embodiment the second dielectric layer 111 may be formed using similar methods and similar processes as the first dielectric layer 107, described above. However, any suitable method may be used to form the second dielectric layer 111.

A second metal layer 113 may be formed in the second dielectric layer 111. In an embodiment the second metal layer 113 may be formed using similar materials and similar process (e.g., damascene or dual damascene) as the first metallization layer 109, described above. However, any suitable method may be utilized to form the second metal layer 113.

A third dielectric layer 115 may be formed over the second dielectric layer 111. In an embodiment the third dielectric layer 115 may be formed using similar methods and similar processes as the first dielectric layer 107, described above. However, any suitable method may be used to form the third dielectric layer 115.

A third metal layer 117 may be formed in the third dielectric layer 115. In an embodiment the third metal layer 117 may be formed using similar materials and similar process (e.g., damascene or dual damascene) as the first metallization layer 109, described above. However, any suitable method may be utilized to form the third metal layer 117.

A fourth dielectric layer 119 may be formed over the third dielectric layer 115. In an embodiment the fourth dielectric layer 119 may be formed using similar methods and similar processes as the first dielectric layer 107, described above. However, any suitable method may be used to form the fourth dielectric layer 119.

A fourth metal layer 121 may be formed in the fourth dielectric layer 119. In an embodiment the fourth metal layer 121 may be formed using similar materials and similar process (e.g., damascene or dual damascene) as the first metallization layer 109, described above. However, any suitable method may be utilized to form the fourth metal layer 121.

A fifth dielectric layer 123 may be formed over the fourth dielectric layer 119. In an embodiment the fifth dielectric layer 123 may be formed using similar methods and similar processes as the first dielectric layer 107, described above. However, any suitable method may be used to form the fifth dielectric layer 123.

A fifth metal layer 125 may be formed in the fifth dielectric layer 123. In an embodiment the fifth metal layer 125 may be a material such as aluminum, titanium, titanium nitride, tantalum nitride, cobalt, silver, gold, copper, nickel, chromium, hafnium, ruthenium, tungsten, platinum, tungsten nitride, combinations of these, or the like. The fifth metal layer 125 may be formed using similar processes (e.g., damascene or dual damascene) as the first metallization layer 109, described above. However, any suitable materials and methods of manufacture may be utilized to form the fifth metal layer 125.

FIG. 1B illustrates a perspective view of the structure formed in FIG. 1A, with FIG. 1A being a cross-sectional view of FIG. 1B along line A-A'. Additionally, for the convenience of viewing the individual structures, the dielectric portions of the structure along with most of the semiconductor substrate 101 have been removed in order to show the conductive connections.

As can be seen better in this view, the active devices 103 over the semiconductor substrate 101 are connected to overlying metal lines. Additionally, the fifth metal layer 125 will act as gateway vias in order to access the overlying memory cell regions 503 (described further below with respect to FIG. 5).

Figure 2:
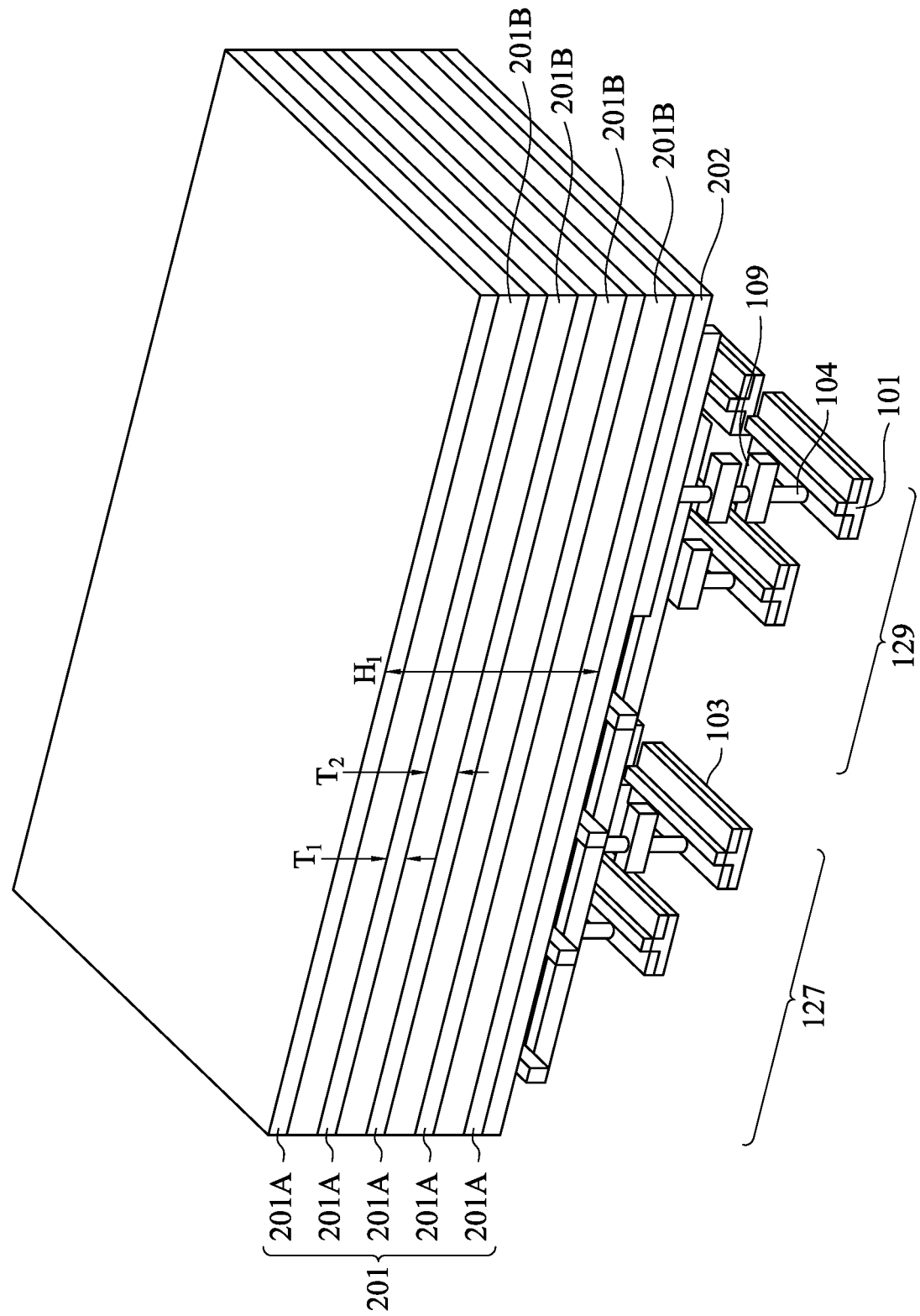
FIG. 2 illustrates a formation of a stack of materials, in accordance with some embodiments.

FIG. 2 illustrates formation of a multilayer stack 201 over the fifth dielectric layer 123. To separate the multilayer stack 201 from the fifth dielectric layer 123, a first hard mask layer 202 is first deposited. In an embodiment the first hard mask layer 202 may be a material such as silicon oxynitride, silicon carbide, silicon oxycarbide, combinations of these, or the like, deposited using a process such as chemical vapor deposition, atomic layer deposition, physical vapor deposition, combinations of these, or the like. However, any suitable material and method of manufacture may be utilized.

The multilayer stack 201 includes alternating first dielectric layers 201A and second dielectric layers 201B. The first dielectric layers 201A are formed of a first dielectric material, and the second dielectric layers 201B are formed of a second dielectric material. In the illustrated embodiment, the multilayer stack 201 includes five layers of the first dielectric layers 201A and four layers of the second dielectric layers 201B. It should be appreciated that the multilayer stack 201 may include any number of the first dielectric layers 201A and the second dielectric layers 201B.

The multilayer stack 201 will be patterned in subsequent processing. The patterned first dielectric layers 201A will be used to isolate subsequently formed thin film transistors (TFTs). The patterned second dielectric layers 201B are sacrificial layers (or dummy layers), which will be removed in subsequent processing and replaced with word lines 1013 (not illustrated in FIG. 2 but illustrated and described further below with respect to FIGS. 10A-10B) for the TFTs. As such, the second dielectric material of the second dielectric layers 201B has a high etching selectivity from the etching of the first dielectric material of the first dielectric layers 201A. In embodiments, the first dielectric layers 201A can be formed of an oxide such as silicon oxide, and the second dielectric layers 201B can be formed of a nitride such as silicon nitride. Other combinations of dielectric materials having acceptable etching selectivity from one another may also be used.

Each layer of the multilayer stack 201 may be formed by an acceptable deposition process such as chemical vapor deposition (CVD), atomic layer deposition (ALD), or the like. A thickness of each of the layers may be in the range of about 15 nm to about 90 nm. In some embodiments, the first dielectric layers 201A are formed to a different thickness than the second dielectric layers 201B. For example, the first dielectric layers 201A can be formed to a first thickness $T_1$ and the second dielectric layers 201B can be formed to a second thickness $T_2$, with the second thickness $T_2$ being from about 0% to about 100% [greater/less] than the first thickness $T_1$. The multilayer stack 201 can have an overall height $H_1$ in the range of about 1000 nm to about 10000 nm (such as about 2000 nm). However, any suitable thicknesses may be utilized.

Figure 3:
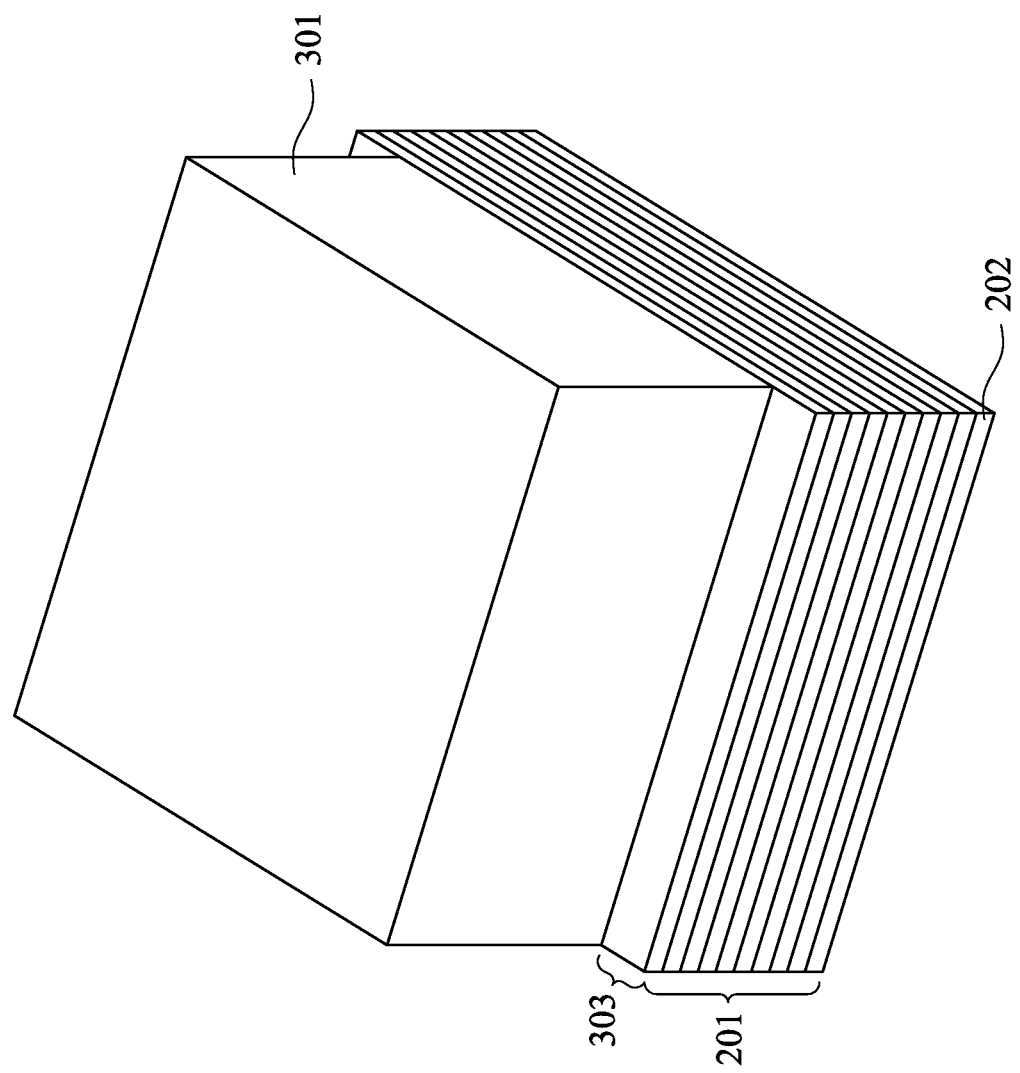
FIG. 3 illustrates placement of a photoresist, in accordance with some embodiments.

In FIG. 3 a photoresist 301 is formed over the multilayer stack 201. For the convenience of this discussion, the structures underlying the first hard mask layer 202 are not illustrated in FIG. 3. The photoresist 301 can be formed by using a spin-on technique and can be patterned using acceptable photolithography techniques. Patterning the photoresist 301 may expose the multilayer stack 201 in a region 303, while masking remaining portions of the multilayer stack 201. For example, a topmost layer of the multilayer stack 201 may be exposed in the region 303.

Figure 4:
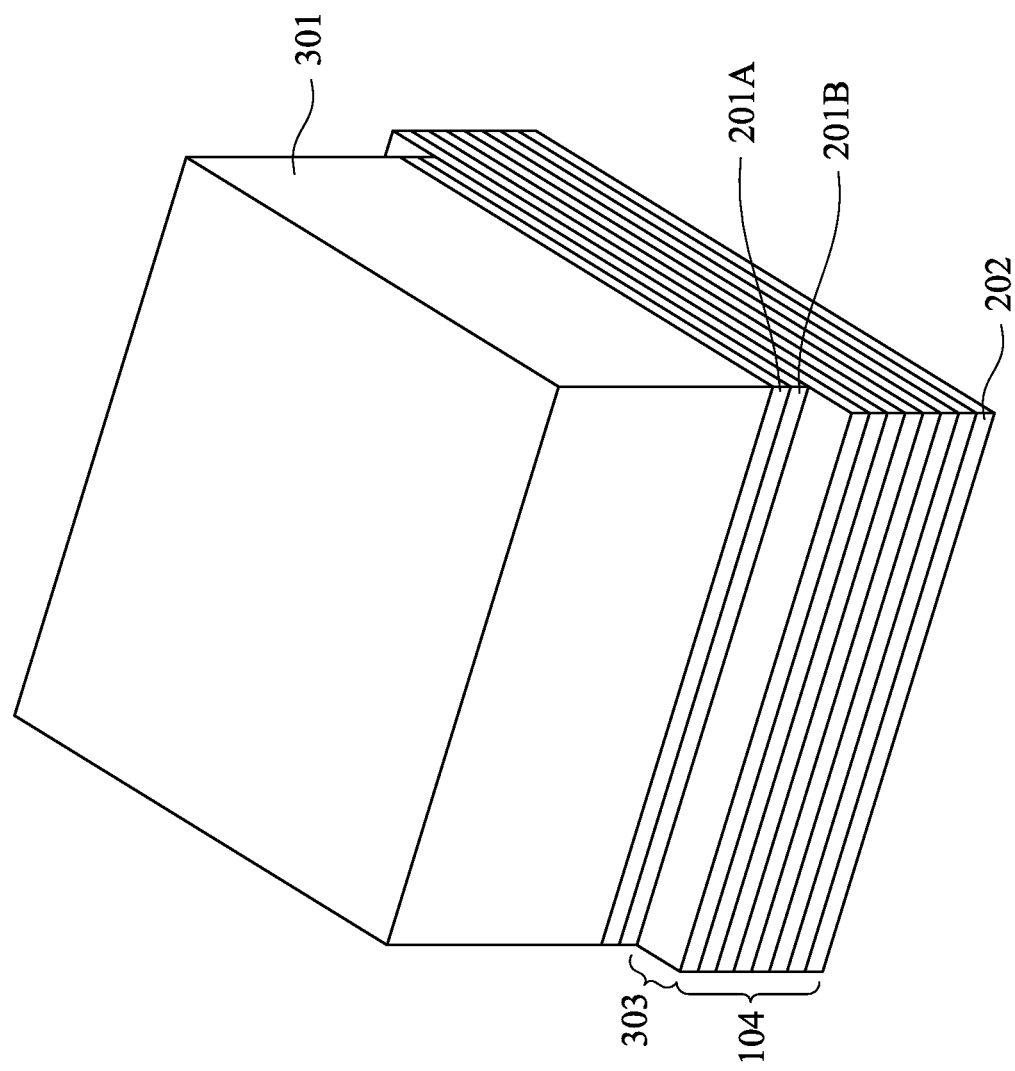
FIG. 4 illustrates a patterning of the stack of material, in accordance with some embodiments.

In FIG. 4, the exposed portions of the multilayer stack 201 in the region 303 are etched using the photoresist 301 as a mask. The etching may be any acceptable etch process, such as wet or dry etching, RIE, NBE, the like, or a combination thereof. The etching may be anisotropic. The etching may remove portions of the first dielectric layers 201A and the second dielectric layers 201B in the region 303. Because the first dielectric layers 201A and the second dielectric layers 201B have different material compositions, etchants used to remove exposed portions of these layers may be different. In some embodiments, the second dielectric layer 201B acts as an etch stop layer while etching the first dielectric layers 201A, and the underlying first dielectric layer 201A act as an etch stop layer while etching the second dielectric layers 201B. As a result, the portions of the first dielectric layers 201A and the second dielectric layers 201B may be selectively removed without removing remaining layers of the multilayer stack 201, and the opening may be extended to a desired depth. In another embodiment, a timed etch processes may be used to stop the etching of the opening after the opening reach a desired depth.

Once the opening has been formed, the photoresist 301 is trimmed to expose additional portions of the multilayer stack 201. The photoresist 301 can be trimmed using acceptable photolithography techniques. As a result of the trimming, a width of the photoresist 301 is reduced, and portions of the multilayer stack 201 in additional regions are exposed. These newly exposed portions of the multilayer stack 201 (along with the underlying portions previously exposed by the etching process), may then be etched using the newly trimmed photoresist 301 as a mask. The etching may be any suitable etching process, such as wet or dry etching, RIE, NBE, the like, or a combination thereof. The etching process may be anisotropic. The etching may extend the opening further into the multilayer stack 201.

Figure 5:
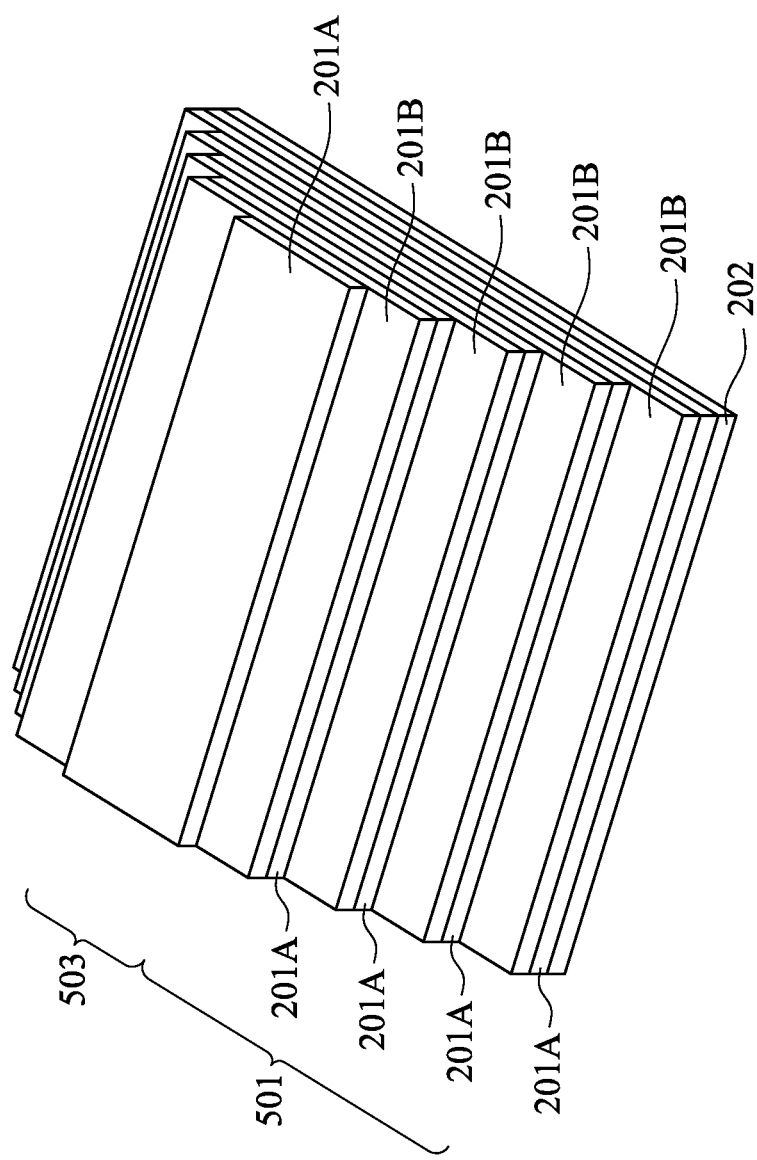
FIG. 5 illustrates formation of a stairstep pattern, in accordance with some embodiments.

FIG. 5 shows that, by repeating the trimming of the photoresist 301 and the etching processes, a stairstep pattern can be formed. In particular, the stairstep pattern is formed wherein overlyings ones of the first dielectric layer 201A and the second dielectric layer 201B are offset from edges of underlying ones of the first dielectric layer 201A and the second dielectric layer 201B.

FIG. 5 additionally illustrates that, once the stairstep pattern has been formed, the photoresist 301 may be removed. In an embodiment the photoresist 301 may be removed using an ashing process, whereby a temperature of the photoresist 301 is increased until the photoresist 301 experiences a decomposition and can be easily removed. However, any suitable process for removing the photoresist 301 may be utilized.

By forming the stairstep pattern and then removing the photoresist 301, the original multilayer stack 201 is separated into a stairstep region 501 and a memory cell region 503. In the stairstep region 501 the number of first dielectric layers 201A and second dielectric layers 201B vary, with some regions having a single set of the first dielectric layers 201A and the second dielectric layers 201B, while other regions have more sets, such as four sets of the first dielectric layers 201A and the second dielectric layers 201B. Additionally, the memory cell region 503 has each layer that was originally deposited within the multilayer stack 201.

Figure 6:
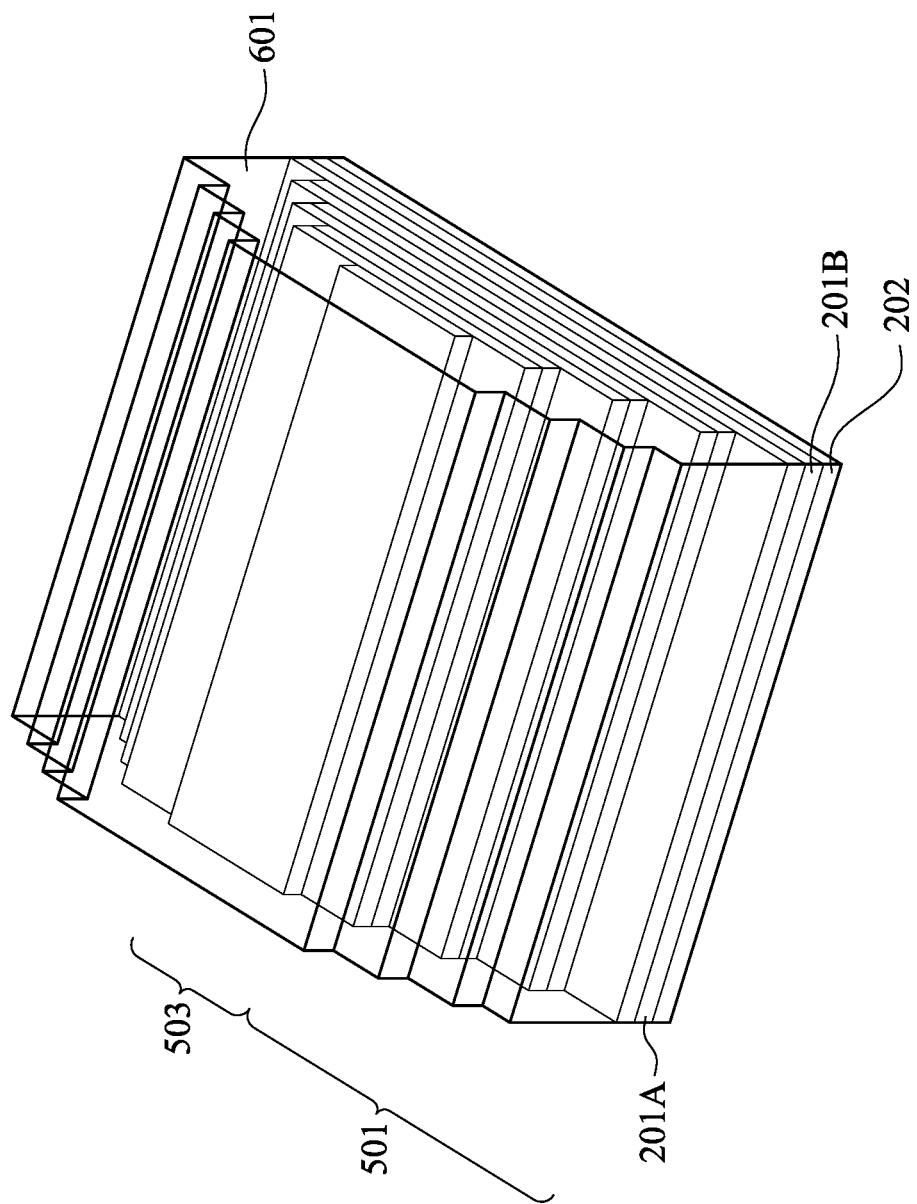
FIG. 6 illustrates deposition of an intermetal dielectric, in accordance with some embodiments.

FIG. 6 illustrates deposition of an intermetal dielectric (IMD) 601. In an embodiment the IMD 601 may be a dielectric material such as silicon oxide, silicon nitride, silicon oxynitride, other low-k dielectric materials, combinations of these or the like. The IMD 601 may be deposited using chemical vapor deposition, atomic layer deposition, physical vapor deposition, spin-on processes, combinations of these, or the like. However, any suitable material and any suitable method may be utilized.

Figure 7A:
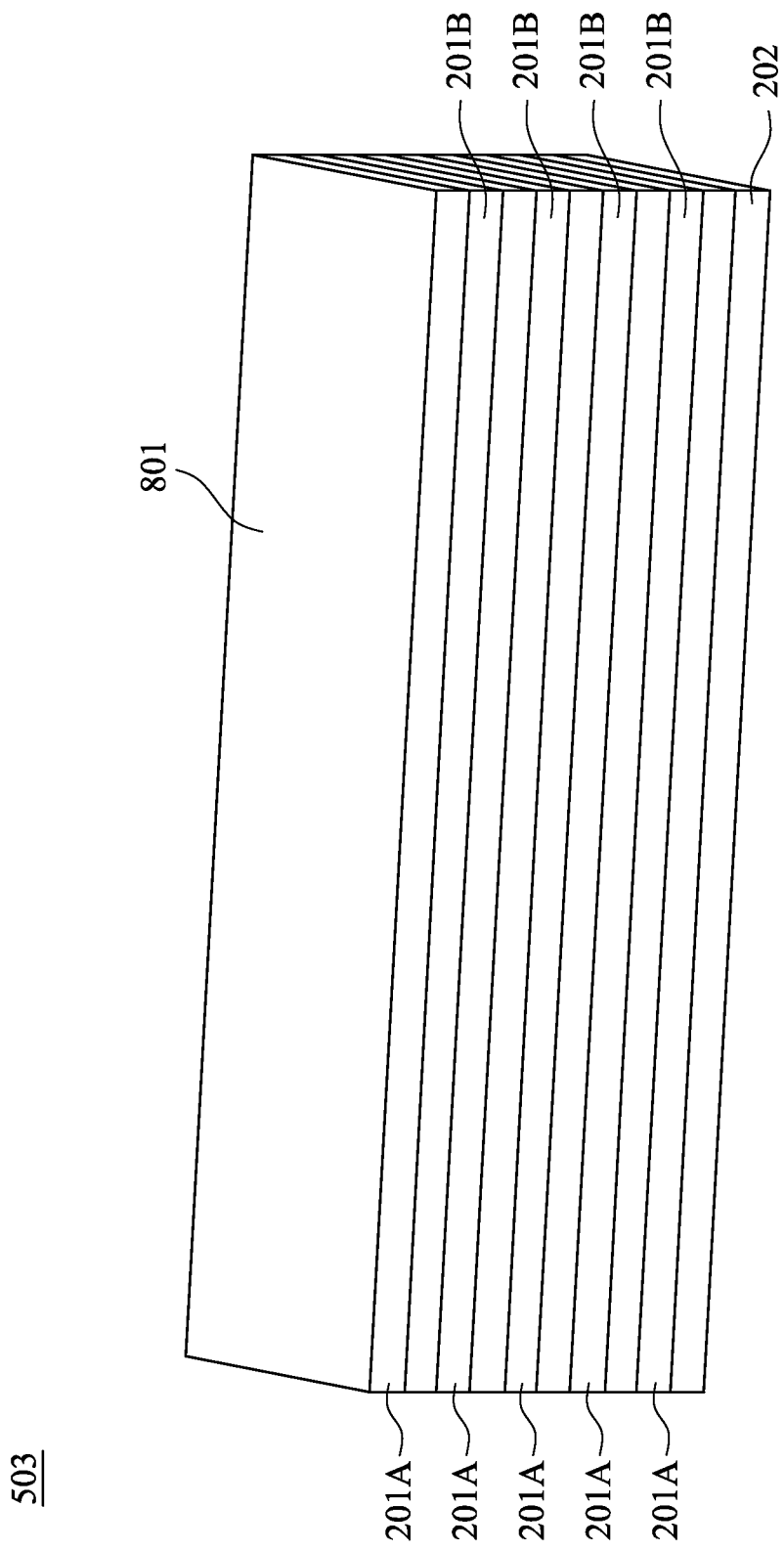
FIGS. 7A-7B illustrate a planarizatoin of the intermetal dielectric, in accordance with some embodiments.
Figure 7B:
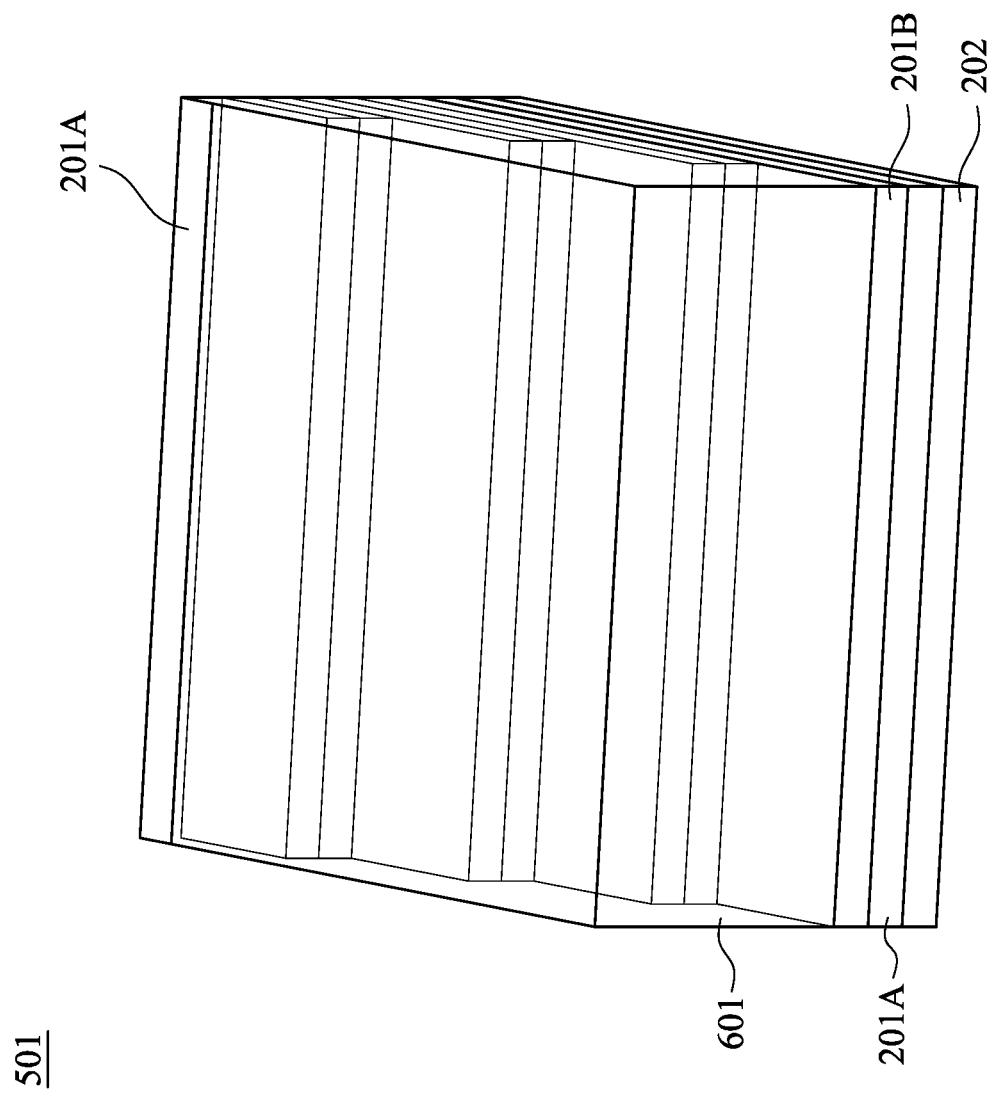

FIGS. 7A-7B illustrate that, once the IMD 601 has been deposited, the IMD 601 is planarized to be coplanar with the top layer of the multilayer stack 201. For convenience of viewing and discussion, the structure illustrated in FIG. 6 has been separated into two figures, with FIG. 7A illustrating the memory cell region 503 while FIG. 7B illustrates the stairstep region 501. In an embodiment the IMD 601 may be planarized using a polishing process, such as a chemical mechanical polishing process, a grinding process, or even a set of one or more etching processes. However, any suitable process may be used to planarize the IMD 601.

Figure 8A:
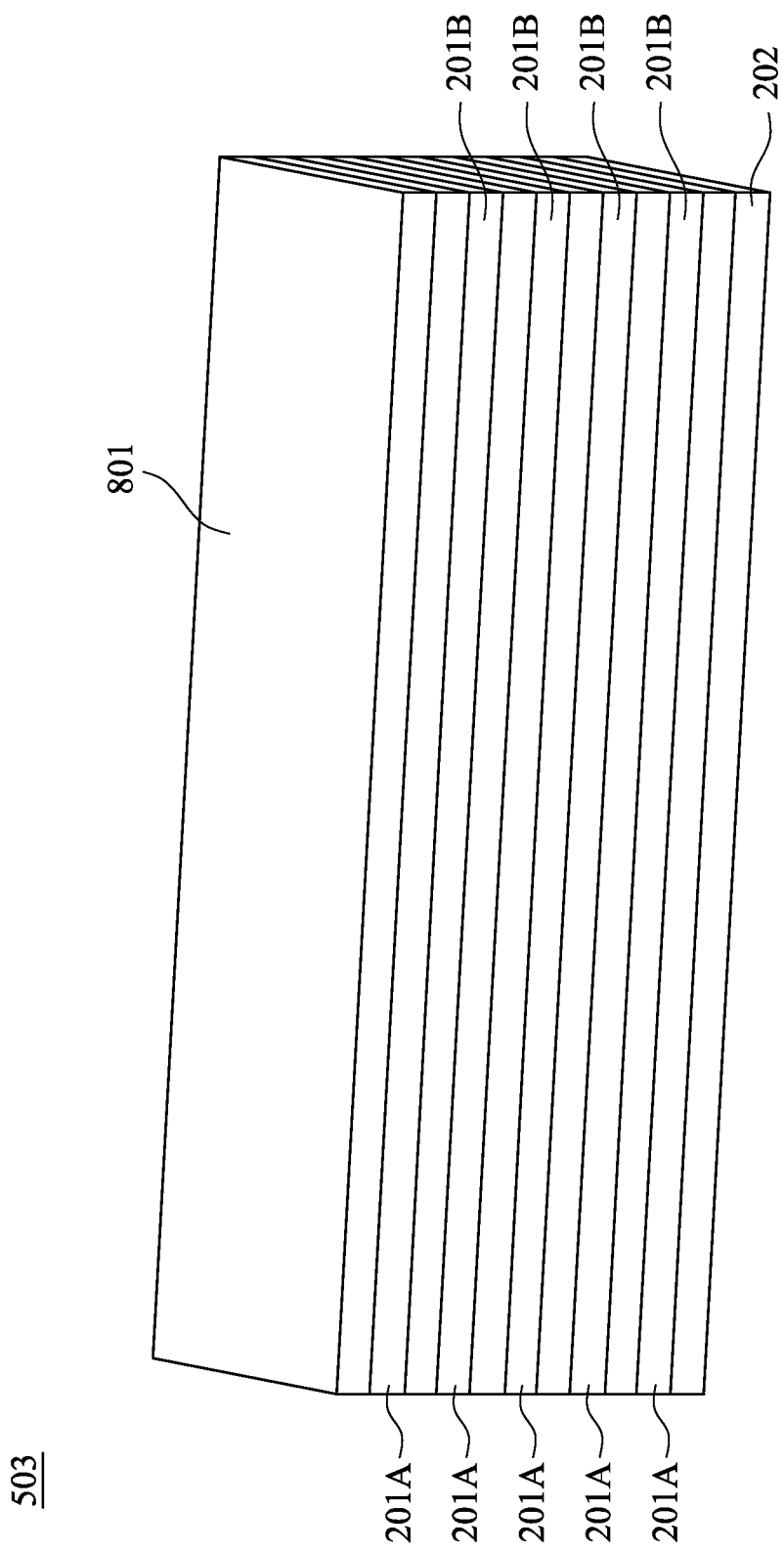
FIGS. 8A-8B illustrate deposition of a hard mask, in accordance with some embodiments.
Figure 8B:
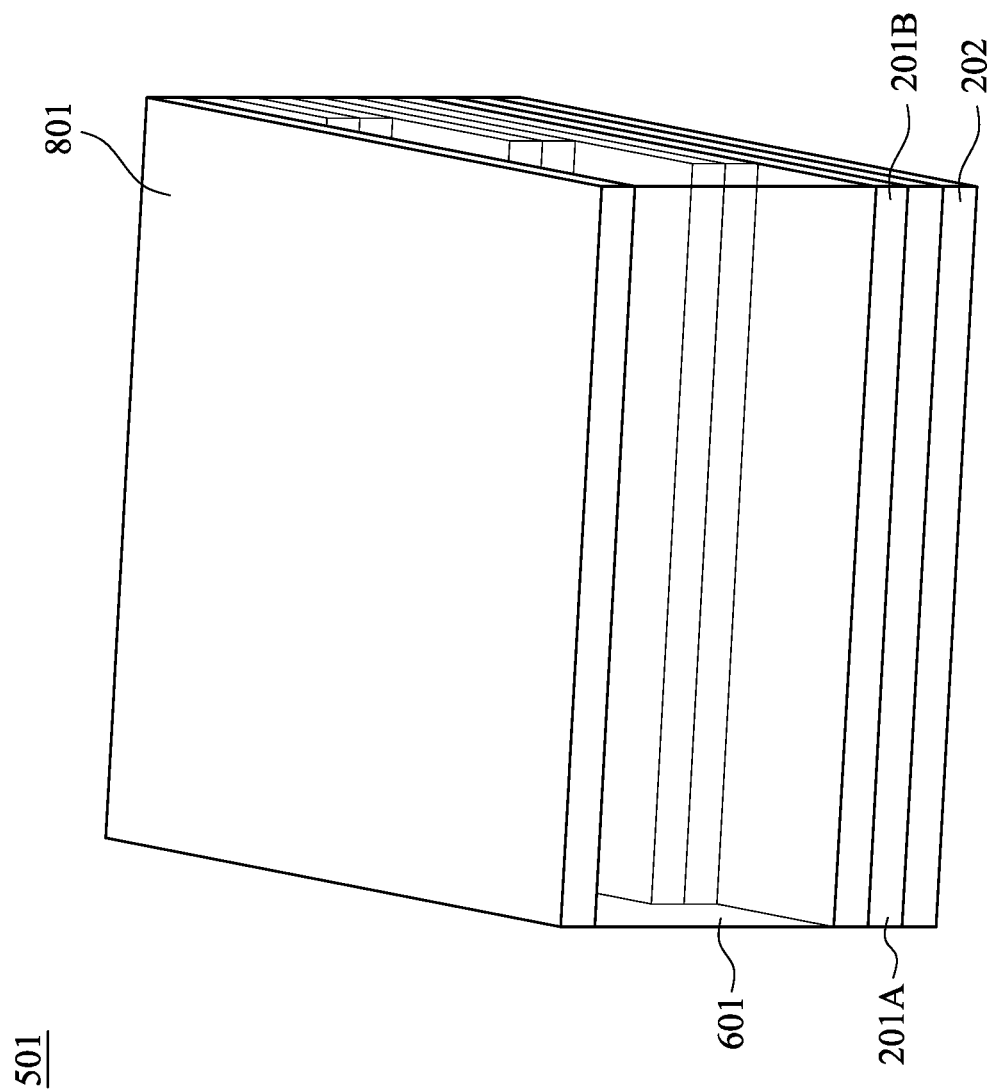

FIGS. 8A-8B (with FIG. 8A illustrating the memory cell region 503 and FIG. 8B illustrating the stairstep region 501) illustrate the start of a patterning process to form trenches through the memory cell region 503. In an embodiment the process is initiated by depositing a first hard mask layer 801, which may be a material such as silicon oxynitride, silicon carbide, silicon oxycarbide, combinations of these, or the like, and may be deposited using a process such as chemical vapor deposition, atomic layer deposition, physical vapor deposition, combinations of these, or the like. However, any suitable material and method of deposition may be utilized.

Figure 9A:
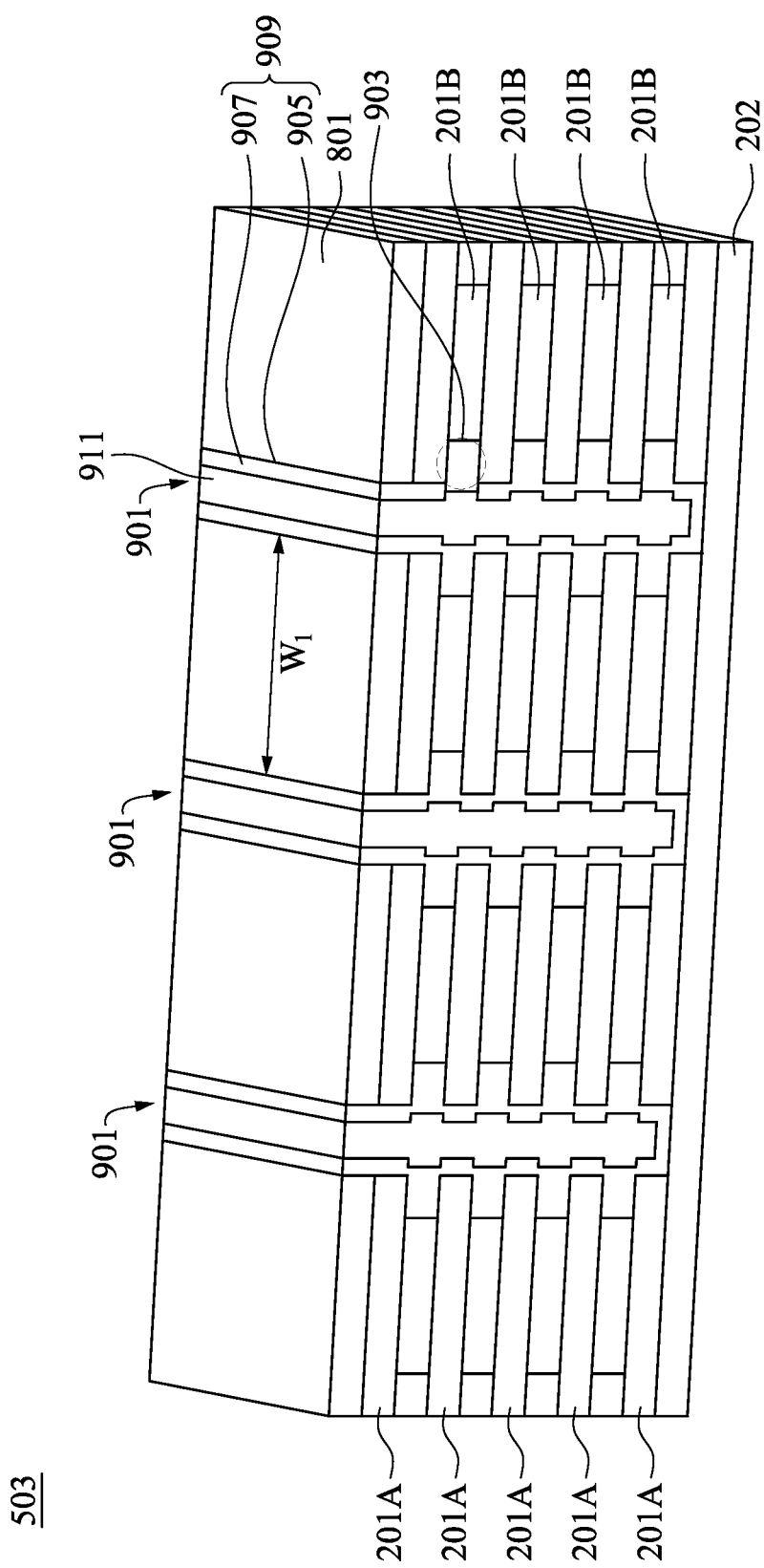
FIGS. 9A-9B illustrate formation of first trenches and filling the first trenches with a conductive material and a dielectric material, in accordance with some embodiments.
Figure 9B:
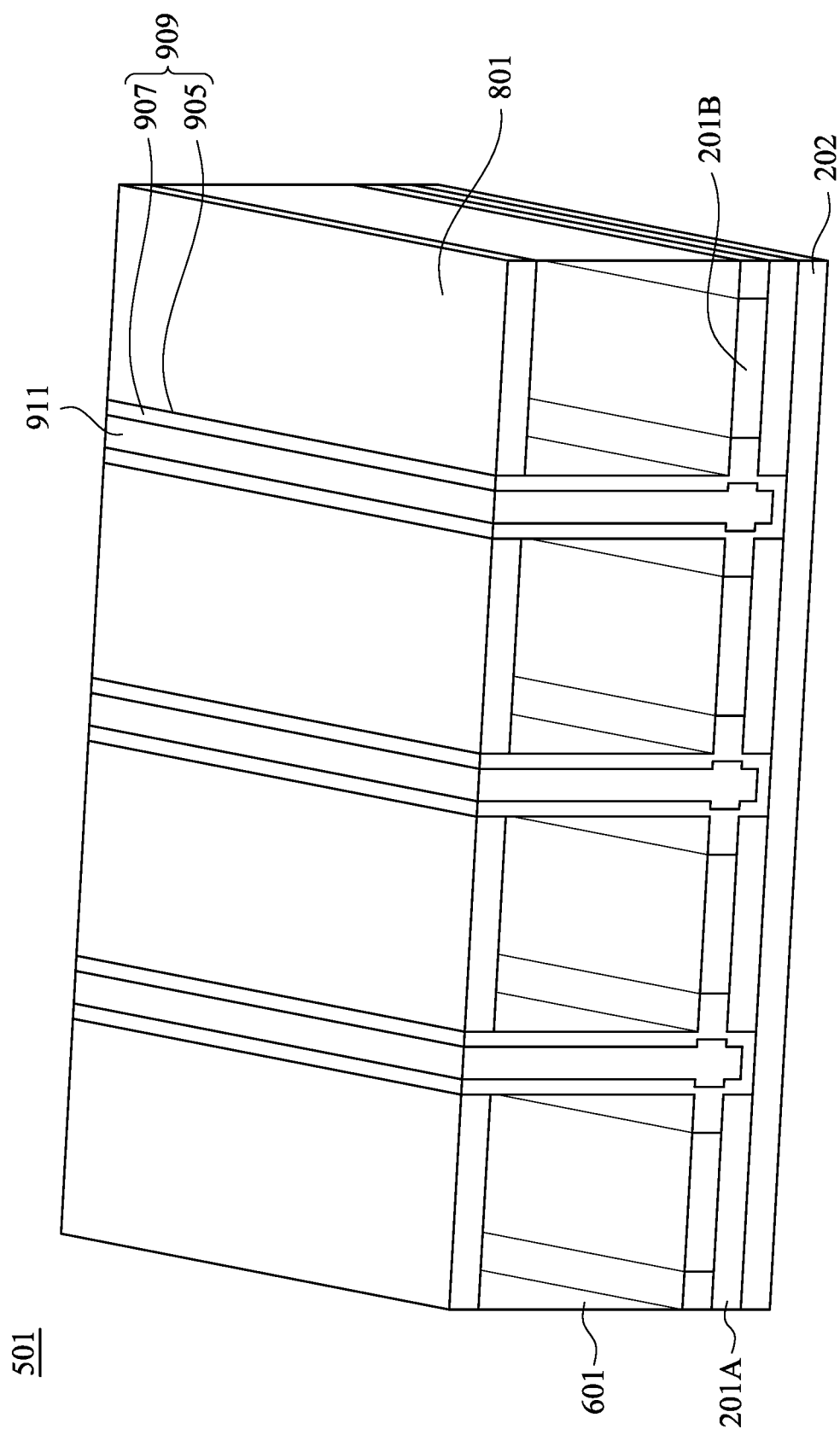

FIGS. 9A-9B (with FIG. 9A illustrating the memory cell region 503 and FIG. 9B illustrating the stairstep region 501) illustrate formation of first trenches 901 in the multilayer stack 201. In the illustrated embodiment, the first trenches 901 extend through the multilayer stack 201. The first trenches 901 may be formed using acceptable photolithography and etching techniques, such as with an etching process that is selective to the multilayer stack 201 (e.g., etches the dielectric materials of the first dielectric layers 201A and the second dielectric layers 201B at a faster rate than the underlying material). The etching may be any acceptable etch process, such as a reactive ion etch (RIE), neutral beam etch (NBE), the like, or a combination thereof. The etching may be anisotropic. In particular embodiments the first trenches 901 can be formed by a dry etch using a fluorine-based gas (e.g., $C_4F_6$) mixed with hydrogen ($H_2$) or oxygen ($O_2$) gas. However, any suitable process may be utilized.

A portion of the multilayer stack 201 is disposed between each pair of the first trenches 901. Each portion of the multilayer stack 201 can have a width $W_1$ in the range of about 50 nm to about 500 nm (such as about 240 nm), and has the height $H_1$ discussed with respect to FIG. 2. The aspect ratio (AR) of each portion of the multilayer stack 201 is the ratio of the height $H_1$ to the width of the narrowest feature of the portion of the multilayer stack 201, which is the width $W_1$ at this step of processing. In accordance with some embodiments, when the first trenches 901 are formed, the aspect ratio of each portion of the multilayer stack 201 is in the range of about 5 to about 15. Forming each portion of the multilayer stack 201 with an aspect ratio of less than about 5 may not allow the memory array to have sufficient memory cell density. Forming each portion of the multilayer stack 201 with an aspect ratio of greater than about 15 may cause twisting or collapsing of the multilayer stack 201 in subsequent processing.

Once the first trenches 901 have been formed, the first trenches 901 are expanded to form first sidewall recesses 903. Specifically, portions of the sidewalls of the second dielectric layers 201B exposed by the first trenches 901 are recessed from the first sidewall recesses 903. Although sidewalls of the second dielectric layers 201B are illustrated as being straight, the sidewalls may be concave or convex. The first sidewall recesses 903 may be formed by an acceptable etching process, such as one that is selective to the material of the second dielectric layers 201B. The etching may be isotropic. In embodiments the first trenches 901 can be expanded by a wet etch using phosphoric acid ($H_3PO_4$). However, any suitable etching process, such as a dry selective etch, may also be utilized.

Once recessed, first conductive features 909 are formed in the first sidewall recesses 903 and to fill and/or overfill the first trenches 901. The first conductive features 909 may each comprise one or more layers, such as seed layers, glue layers, barrier layers, and diffusion layers, and the like. In some embodiments, the first conductive features 909 each include a seed layer 905 (or glue layer) and a main layer 907, although in other embodiments the seed layer 905 may be omitted. Each seed layer 905 extends along three sides (e.g., the top surface, a sidewall, and the bottom surface) of the material of a corresponding main layer 907 located within the first sidewall recesses 903. The seed layers 905 are formed of a first conductive material that can be utilized to help grow or to help adhere the subsequently deposited material, such as titanium nitride, tantalum nitride, titanium, tantalum, molybdenum, ruthenium, rhodium, hafnium, iridium, niobium, rhenium, tungsten, combinations of these, oxides of these, or the like. The main layers 907 may be formed of a second conductive material, such as a metal, such as tungsten, cobalt, aluminum, nickel, copper, silver, gold, molybdenum, ruthenium, molybdenum nitride, titanium, titanium nitride, tantalum nitride, chromium, hafnium, platinum, tungsten nitride, alloys thereof, or the like. In a particular embodiment where the first dielectric layers 201A are formed of an oxide such as silicon oxide, the seed layer 905 can be formed of titanium nitride and the main layers can be formed of tungsten. The seed layer 905 and main layers 907 may each be formed by an acceptable deposition process such as chemical vapor deposition (CVD), atomic layer deposition (ALD), or the like.

Once the first conductive features 909 have been formed, a remainder of the first trenches 901 may be filled with a first dielectric material 911 in order to provide additional structural support. In an embodiment the first dielectric material 911 may be a material such as silicon oxide, formed using a deposition process such as chemical vapor deposition, atomic layer deposition, physical vapor deposition, combinations, of these, or the like. However, any suitable material and method may be utilized.

Once the first conductive features 909 and the first dielectric material 911 have been deposited in order to fill and/or overfill the first trenches 901, the first conductive features 909 and the first dielectric material 911 may be planarized to removed excess material outside of the first trenches 901, such that after the planarizing the first conductive features 909 and the first dielectric material 911 the first conductive features 909 and the first dielectric material 911 completely span a top portion of the first trenches 901. In an embodiment the first conductive features 909 and the first dielectric material 911 may be planarized using, e.g., a chemical mechanical planarization (CMP) process. However, any suitable planarization process, such as a grinding process, may also be utilized.

FIG. 9B illustrates that the first conductive features 909 are formed not only within the memory cell region 503 but are also formed within the stairstep region 501. However, in the stairstep regions 501, the first conductive features 909 may be formed to have only a single first sidewall recess 903 at the illustrated point (although additional first sidewall recesses 903 may be formed in additional layers that are not illustrated. As such, the first conductive features 909 have straight sidewalls along a much long length than within the memory cell region 503.

Figure 10A:
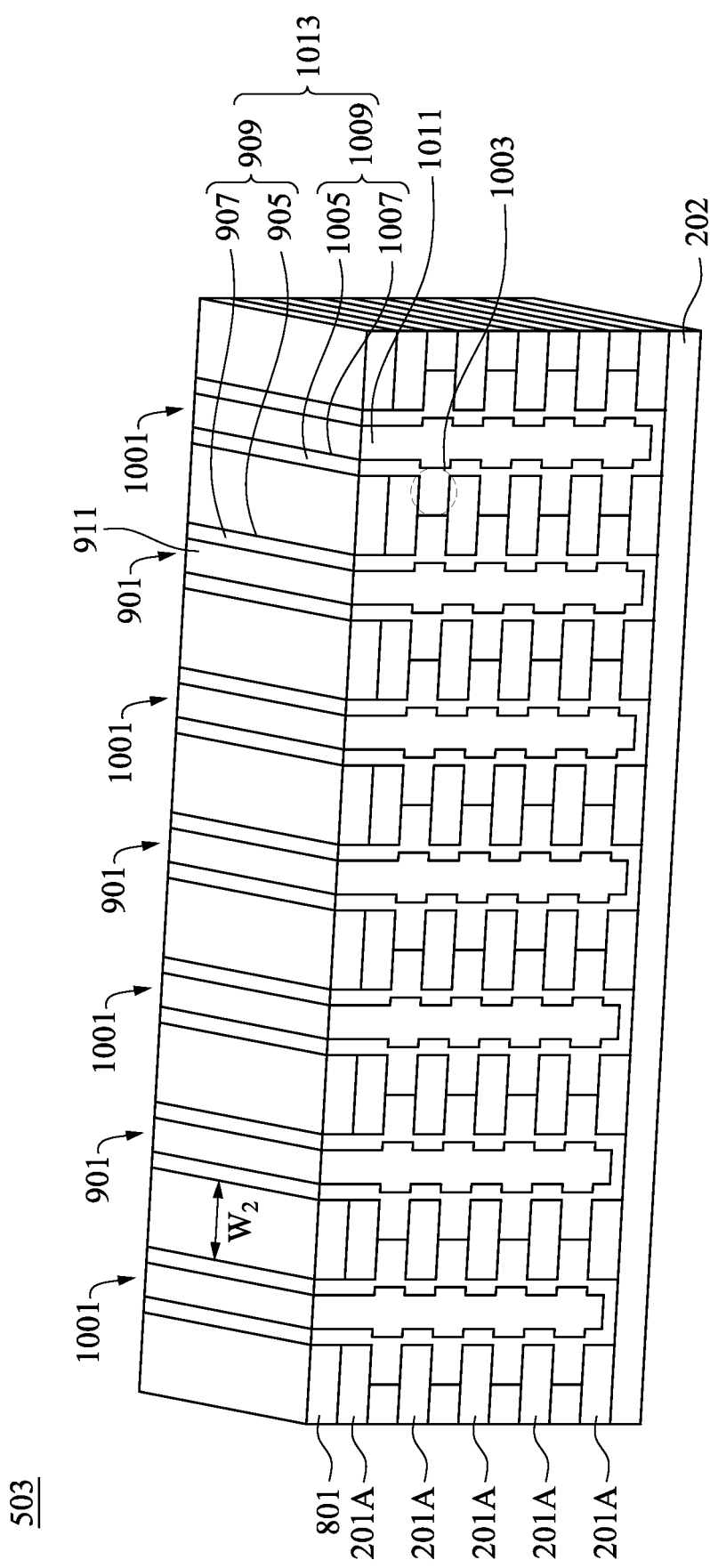
FIGS. 10A-10B illustrate formation of second trenches and filling the second trenches with a conductive material and a dielectric material, in accordance with some embodiments.
Figure 10B:
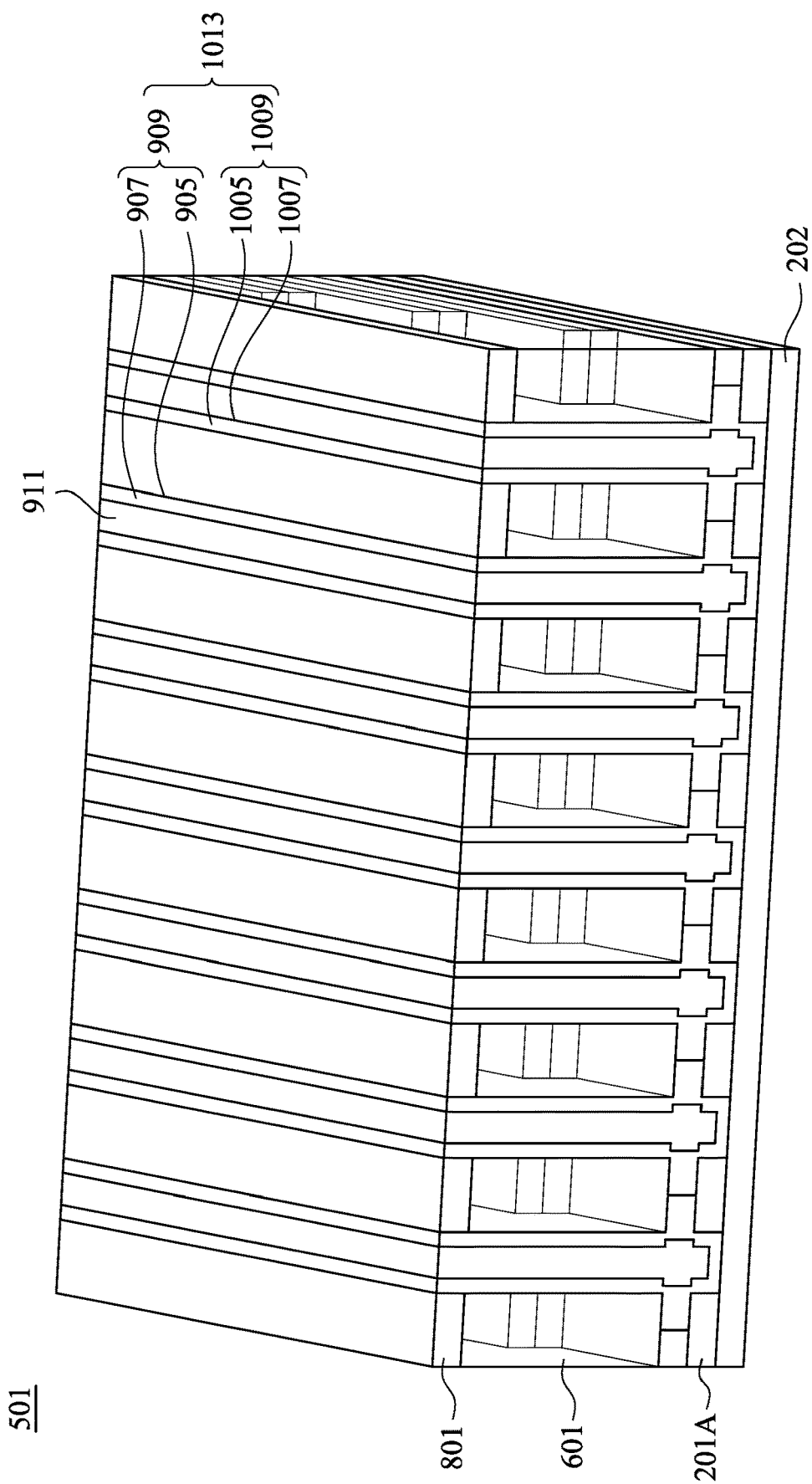

FIGS. 10A-10B (with FIG. 10A illustrating the memory cell region 503 and FIG. 10B illustrating the stairstep region 501) illustrate formation of second trenches 1001 in the multilayer stack 201. In the illustrated embodiment, the second trenches 1001 extend through the multilayer stack 201. The second trenches 1001 may be formed using acceptable photolithography and etching techniques, such as with an etching process that is selective to the multilayer stack 201 (e.g., etches the dielectric materials of the first dielectric layers 201A and the second dielectric layers 201B at a faster rate than the material of the substrate 102). The etching may be any acceptable etch process, and in some embodiments, may be similar to the etch used to form the first trenches 901 discussed with respect to FIGS. 9A and 9B.

A portion of the multilayer stack 201 is disposed between each second trench 1001 and first trench 901. Each portion of the multilayer stack 201 can have a width W2 in the range of about 50 nm to about 500 nm, and has the height $H_1$ discussed with respect to FIG. 2. The aspect ratio (AR) of each portion of the multilayer stack 201 is the ratio of the height $H_1$ to the width of the narrowest feature of the portion of the multilayer stack 201, which is the width W2 at this step of processing. In accordance with some embodiment, when the second trenches 1001 are formed, the aspect ratio of each portion of the multilayer stack 201 is in the range of about 5 to about 15. Forming each portion of the multilayer stack 201 with an aspect ratio of less than about 5 may not allow the memory array 52 to have sufficient memory cell density. Forming each portion of the multilayer stack 201 with an aspect ratio of greater than about 15 may cause twisting or collapsing of the multilayer stack 201 in subsequent processing.

Once the second trenches have been formed, the second trenches 1001 are expanded to form second sidewall recesses 1003. Specifically, the remaining portions of the second dielectric layers 201B are removed to form the second sidewall recesses 1003. The second sidewall recesses 1003 thus expose portions of the first conductive features 909. The second sidewall recesses 1003 may be formed by an acceptable etching process, such as one that is selective to the material of the second dielectric layers 201B (e.g., selectively etches the material of the second dielectric layers 201B at a faster rate than the materials of the first dielectric layers 201A). The etching may be any acceptable etch process, and in some embodiments, may be similar to the etch used to form the first sidewall recesses 903 discussed with respect to FIGS. 9A and 9B.

Once the second sidewall recesses 1003 have been formed, second conductive features 1009 and a second dielectric material 1011 are formed in the second sidewall recesses 1003 and to fill and/or overfill the second trenches 1001. The second conductive features 1009 may be formed of materials that are selected from the same group of candidate materials of the first conductive features 909, and may be formed using methods that are selected from the same group of candidate methods for forming the materials of the first conductive features 909. The first conductive features 909 and the second conductive features 1009 may be formed from the same material, or may include different materials. In some embodiments, the second conductive features 1009 each include a seed layer 1005 and a main layer 1007, although in other embodiments the seed layer 1005 may be omitted. The seed layer 1005 and the main layers 1007 of the second conductive features 1009 can have similar thicknesses as the seed layer 905 and the main layers 907 of the first conductive features 909, respectively. In some embodiments, the seed layer 905 and the seed layer 1005 are formed of similar materials, in which case the seed layer 905 and the seed layer 1005 may merge during formation such that no discernable interfaces exist between then. In other embodiments, the seed layer 905 and the seed layer 1005 are formed of different materials, in which case the seed layer 905 and the seed layer 1005 may not merge during formation such that discernable interfaces exist between then.

Once the second conductive features 1009 have been formed, a remainder of the second trenches 1001 may be filled with the second dielectric material 1011 in order to provide additional structural support. In an embodiment the second dielectric material 1011 may be a material such as silicon oxide, formed using a deposition process such as chemical vapor deposition, atomic layer deposition, physical vapor deposition, combinations, of these, or the like. However, any suitable material and method may be utilized.

Once the second conductive features 1009 and the second dielectric material 1011 have been deposited in order to fill and/or overfill the second trenches 1001, the second conductive features 1009 and the second dielectric material 1011 may be planarized to removed excess material outside of the second trenches 1001, such that after the planarizing the second conductive features 1009 and the second dielectric material 1011 the second conductive features 1009 and the second dielectric material 1011 completely span a top portion of the second trenches 1001. In an embodiment the second conductive features 1009 and the second dielectric material 1011 may be planarized using, e.g., a chemical mechanical planarization (CMP) process. However, any suitable planarization process, such as a grinding process, may also be utilized.

The first conductive features 909 and the second conductive features 1009 are collectively referred to as word lines 1013 of the memory cell region 503. Adjacent pairs of the first conductive features 909 and the second conductive features 1009 are in physical contact with one another and are electrically coupled to one another. Thus, each pair of a first conductive feature 909 and a second conductive feature 1009 functions as a single word line 1013.

FIG. 10B illustrates that the second conductive features 1009 are formed not only within the memory cell region 503 but are also formed within the stairstep region 501. However, in the stairstep regions 501, the second conductive features 1009 may be formed to have only a single second sidewall recess 1003 at the illustrated point (although additional sidewall recesses may be formed in additional layers that are not as clearly illustrated). As such, the second conductive features 1009 have straight sidewalls along a much long length than within the memory cell region 503.

Figure 11A:
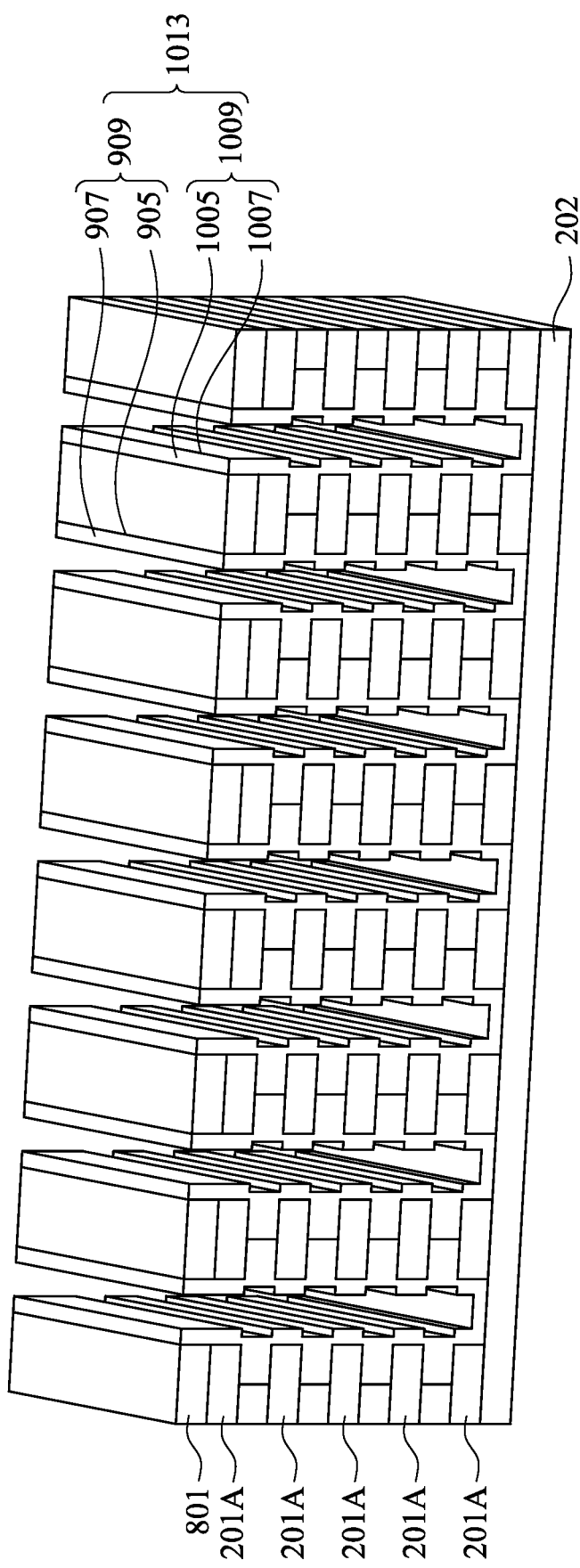
FIGS. 11A-11B illustrate removal of the dielectric material, in accordance with some embodiments.
Figure 11B:
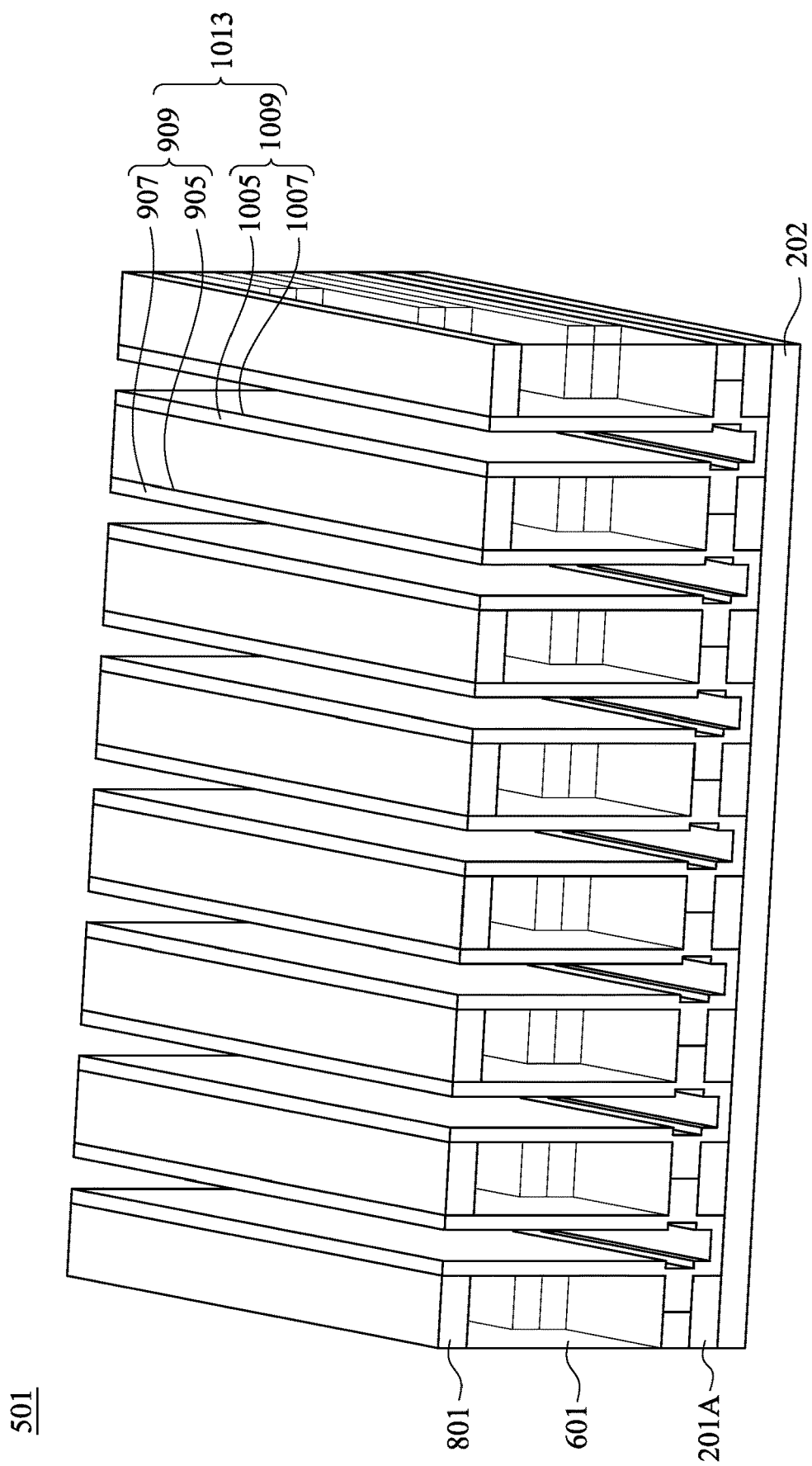

FIGS. 11A-11B (with FIG. 11A illustrating the memory cell region 503 and FIG. 11B illustrating the stairstep region 501) illustrate an etch back process in order to remove the first dielectric material 911 and the second dielectric material 1011. In an embodiment the etch back process may be performed using, e.g., a wet etching process or an anisotropic etching process However, any suitable etching process may be utilized.

Figure 12A:
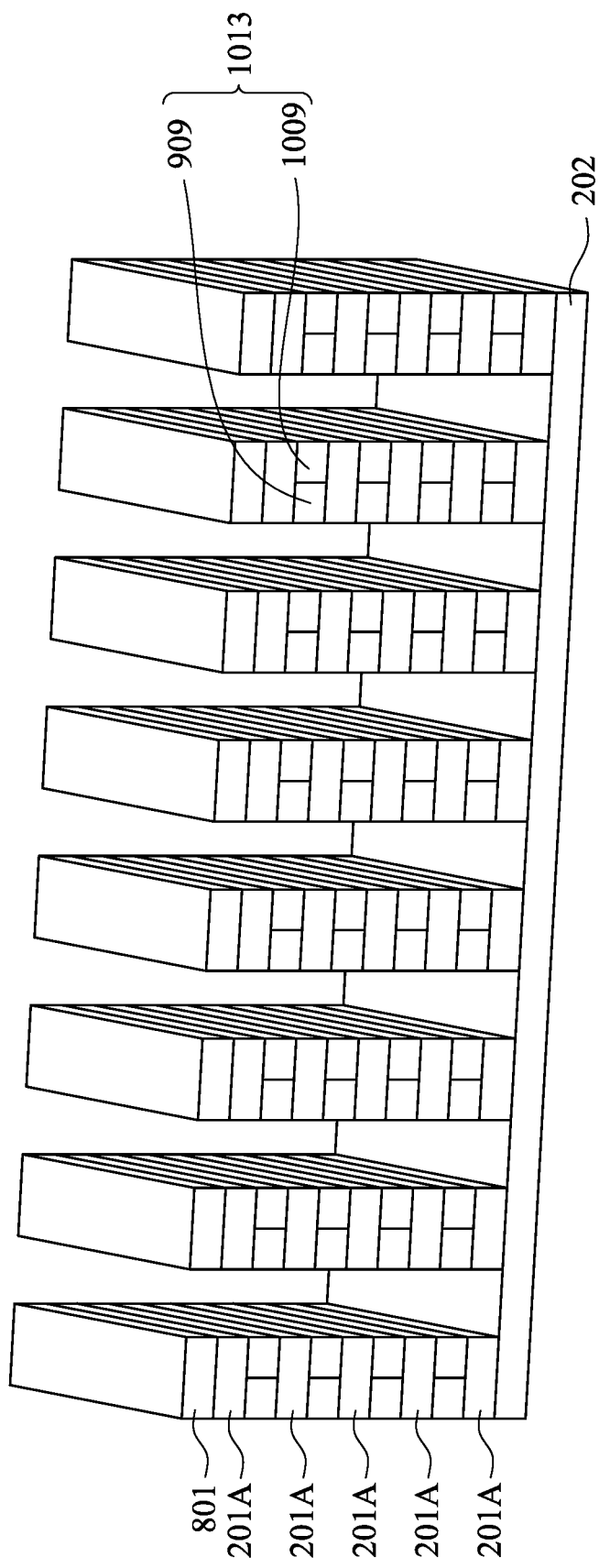
FIGS. 12A-12B illustrate patterning of the conductive material, in accordance with some embodiments.
Figure 12B:
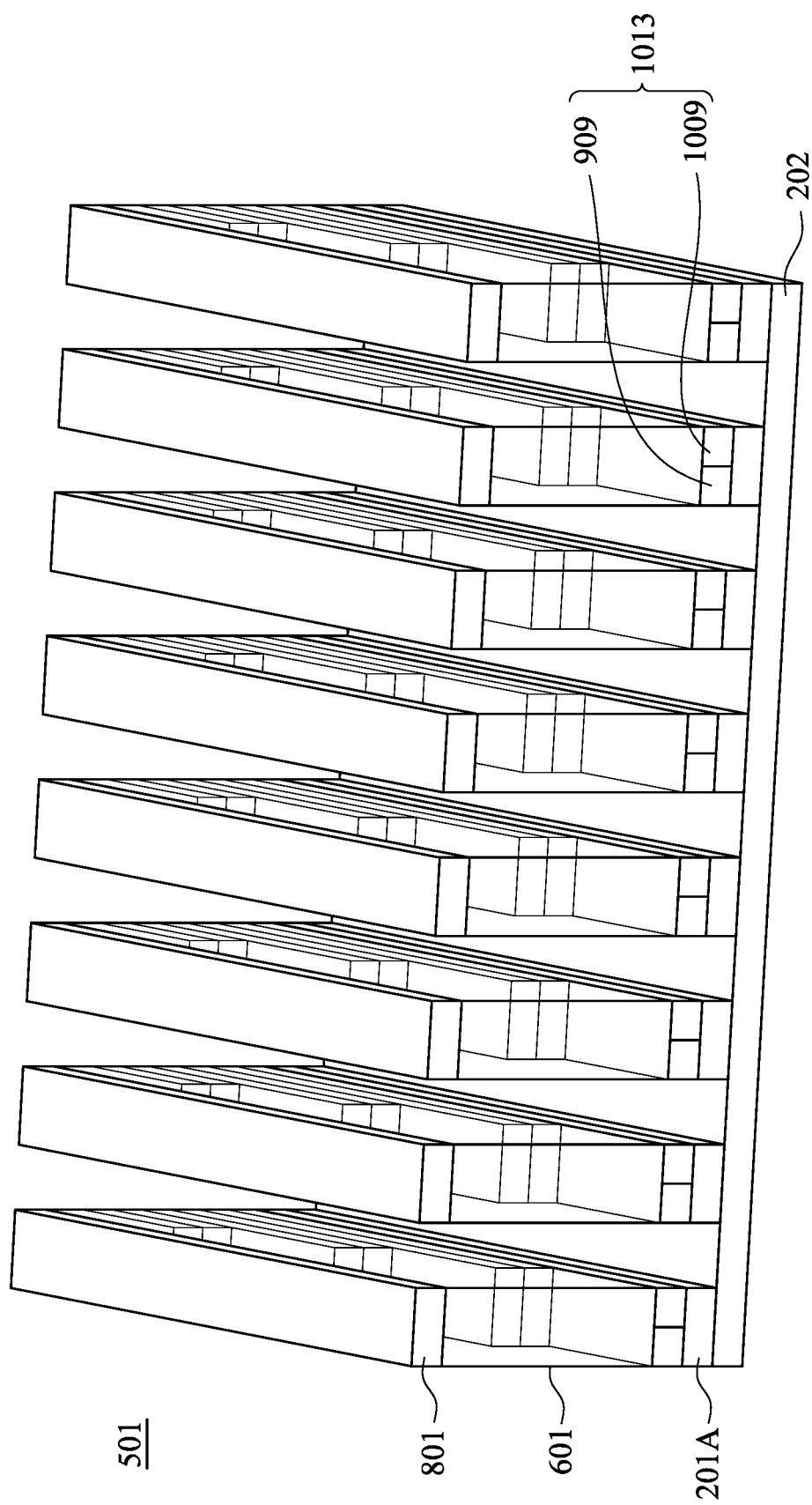

FIGS. 12A-12B (with FIG. 12A illustrating the memory cell region 503 and FIG. 12B illustrating the stairstep region 501) illustrate an etch back process in order to remove excess portions of the first conductive features 909 and the second conductive features 1009. In an embodiment the etch back process may be performed using, e.g., an anisotropic etching process However, any suitable etching process may be utilized. Additionally, for convenience the individual portions of the first conductive features 909 (e.g., the seed layer 905 and main layer 907) and the second conductive features 1009 (e.g., the seed layer 1005 and main layer 1007) have been merged into single structures labeled the first conductive features 909 and the second conductive features 1009.

In an embodiment the etch back process is performed until the material of the first conductive features 909 and the second conductive features 1009 that are not covered by the first dielectric layers 201A have been removed. As such, the remaining material of the first conductive features 909 and the second conductive features 1009 has a similar width as the remaining portion of the first dielectric layers 201A. However, any suitable dimension may be utilized.

FIG. 12B illustrates that the etch back process is performed to pattern the first conductive features 909 and the second conductive features 1009 not only within the memory cell region 503 but are also formed within the stairstep region 501. However, with the first dielectric material 911 and the second dielectric material 1011 removed and the first conductive features 909 and the second conductive features 1009 patterned, additional ones of the word lines 1013 are present.

Figure 13A:
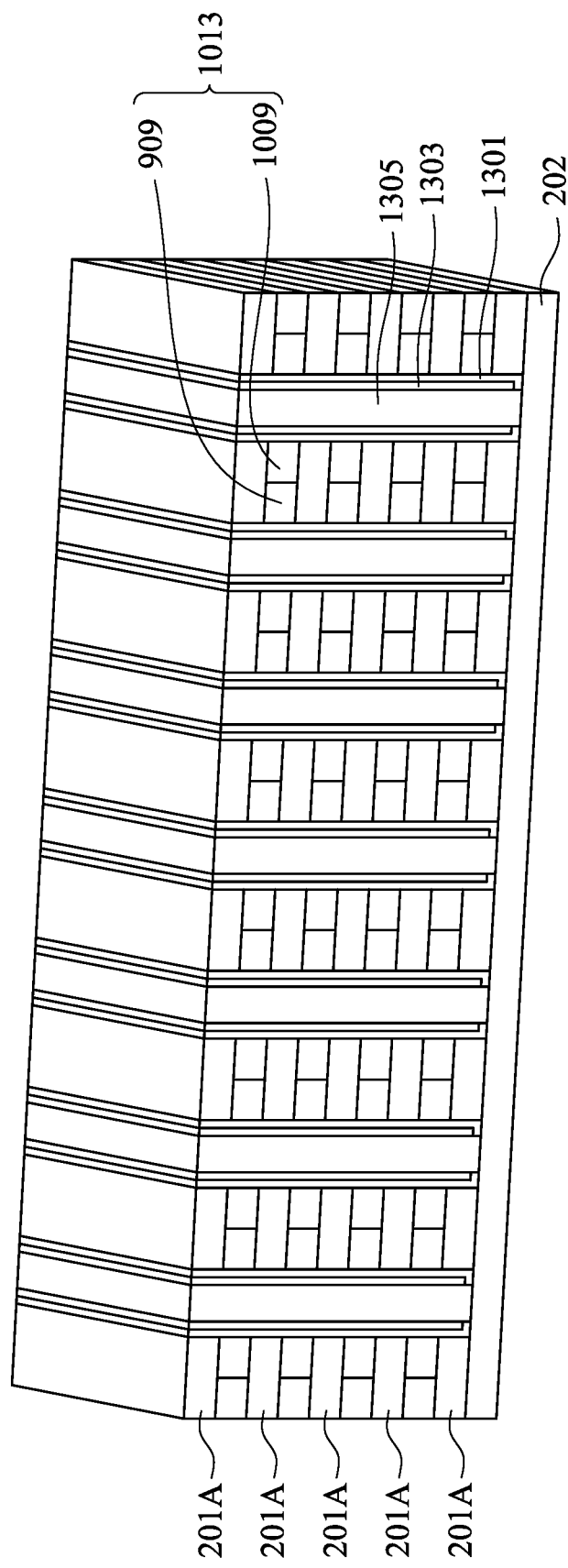
FIGS. 13A-13B illustrate deposition of ferroelectric strips, semiconductor strips, and dielectric layers, in accordance with some embodiments.
Figure 13B:
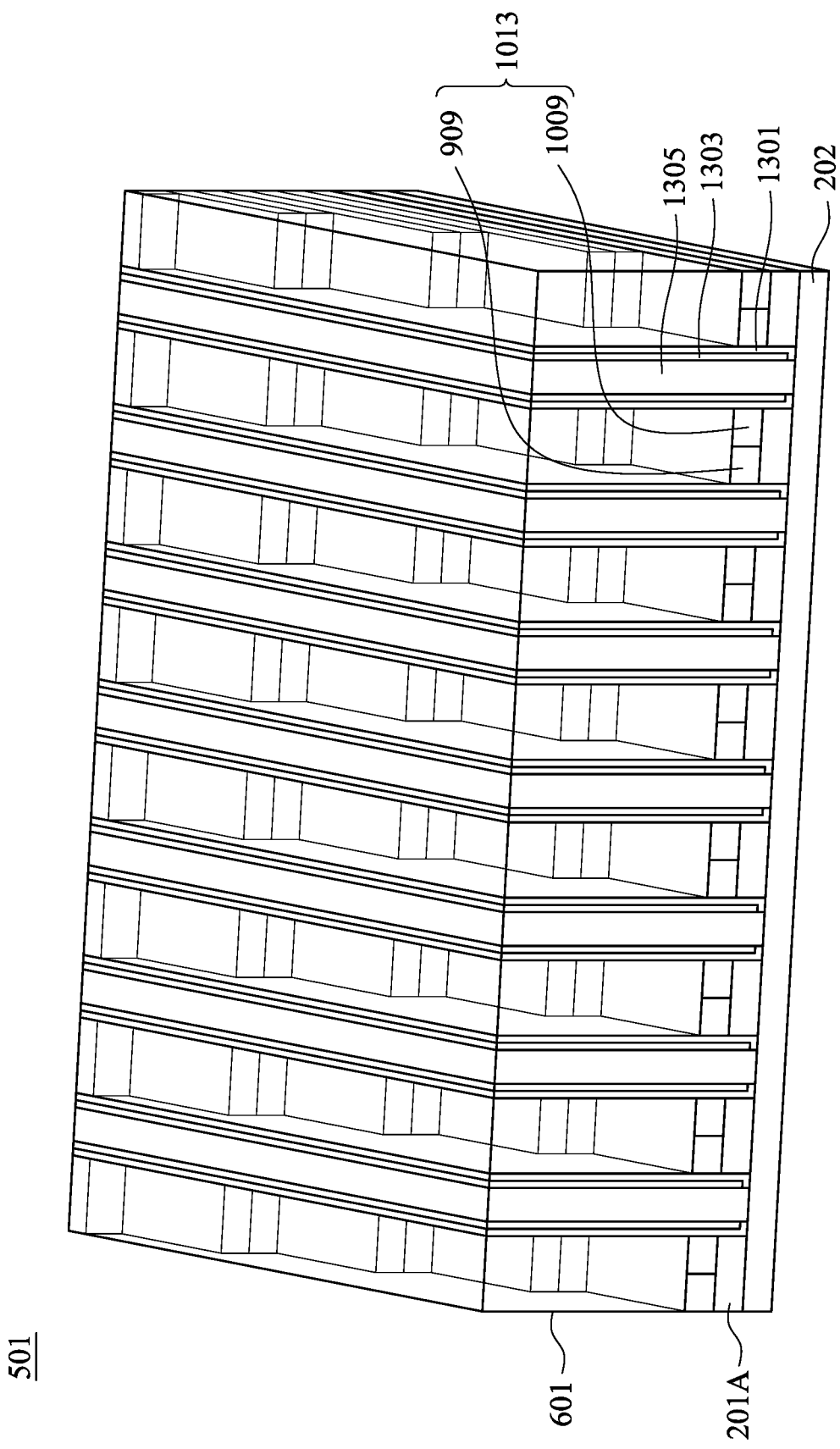

FIGS. 13A-13B (with FIG. 13A illustrating the memory cell region 503 and FIG. 13B illustrating the stairstep region 501) illustrate TFT film stacks are formed in the first trenches 901 and the second trenches 1001. Specifically, two ferroelectric strips 1301, a semiconductor strip 1303, and a dielectric layer 1305 are formed in each of the first trenches 901 and the second trenches 1001. In this embodiment, no other layers are formed in the first trenches 901 and the second trenches 1001. In another embodiment additional layers may be are formed in the first trenches 901 and the second trenches 1001.

The ferroelectric strips 1301 are data storage strips formed of an acceptable ferroelectric material for storing digital values, such as hafnium zirconium oxide (HfZrO); hafnium aluminum oxide (HfAlO), zirconium oxide (ZrO); hafnium oxide (HfO) doped with lanthanum (La), silicon (Si), gadolinium (Gd), aluminum (Al), or the like; undoped hafnium oxide (HfO); lead zirconate titanate (PZT), strontium bismuth tantalate (SBT) or the like. The material of the ferroelectric strips 1301 maybe formed by an acceptable deposition process such as ALD, CVD, physical vapor deposition (PVD), or the like.

The semiconductor strips 1303 are formed of an acceptable semiconductor material for providing channel regions of TFTs, such as indium tin oxide (ITO), zinc oxide (ZnO), indium tungsten oxide (InWO), indium gallium zinc oxide (InGaZnO), indium zinc oxide (InZnO), indium tin oxide (ITO), indium gallium zinc tin oxide (IGZTO), polysilicon, amorphous silicon, or the like. The material of the semiconductor strips 1303 may be formed by an acceptable deposition process such as ALD, CVD, PVD, or the like.

The dielectric layers 1305 are formed of a dielectric material. Acceptable dielectric materials include oxides such as silicon oxide and aluminum oxide; nitrides such as silicon nitride; carbides such as silicon carbide; the like; or combinations thereof such as silicon oxynitride, silicon oxycarbide, silicon carbonitride, or the like. The material of the dielectric layers 1305 may be formed by an acceptable deposition process such as ALD, CVD, flowable CVD (FCVD), or the like.

The ferroelectric strips 1301, the semiconductor strips 1303, and the dielectric layers 1305 may be formed by a combination of deposition, etching, and planarization. For example, a ferroelectric layer can be conformally deposited on the multilayer stack 201 and in the first trenches 901 (e.g., on sidewalls of the first conductive features 909 and sidewalls of the first dielectric layers 201A). A semiconductor layer can then be conformally deposited on the ferroelectric layer. The semiconductor layer can then be anisotropically etched to remove horizontal portions of the semiconductor layer, thus exposing the ferroelectric layer. A dielectric layer can then be conformally deposited on the remaining vertical portions of the semiconductor layer and the exposed portions of the ferroelectric layer. A planarization process is then applied to the various layers to remove excess materials over the multilayer stack 201. The planarization process may be a chemical mechanical polish (CMP), an etch-back process, combinations thereof, or the like. The portions of the ferroelectric layer, the semiconductor layer, and the dielectric layer remaining in the first trenches 901 form the ferroelectric strips 1301, the semiconductor strips 1303, and the dielectric layers 1305, respectively. The planarization process exposes the multilayer stack 201 such that top surfaces of the multilayer stack 201, the ferroelectric strips 1301, the semiconductor strips 1303, and the dielectric layers 1305 are coplanar (within process variations) after the planarization process.

FIG. 13B illustrates that the deposition of the ferroelectric strips 1301, the semiconductor strips 1303, and the dielectric layers 1305 is performed not only within the memory cell region 503 but are also within the stairstep region 501. As such, the ferroelectric strips 1301, the semiconductor strips 1303, and the dielectric layers 1305 extend into the stairstep region 501 adjacent to the word lines 1013.

Figure 14A:
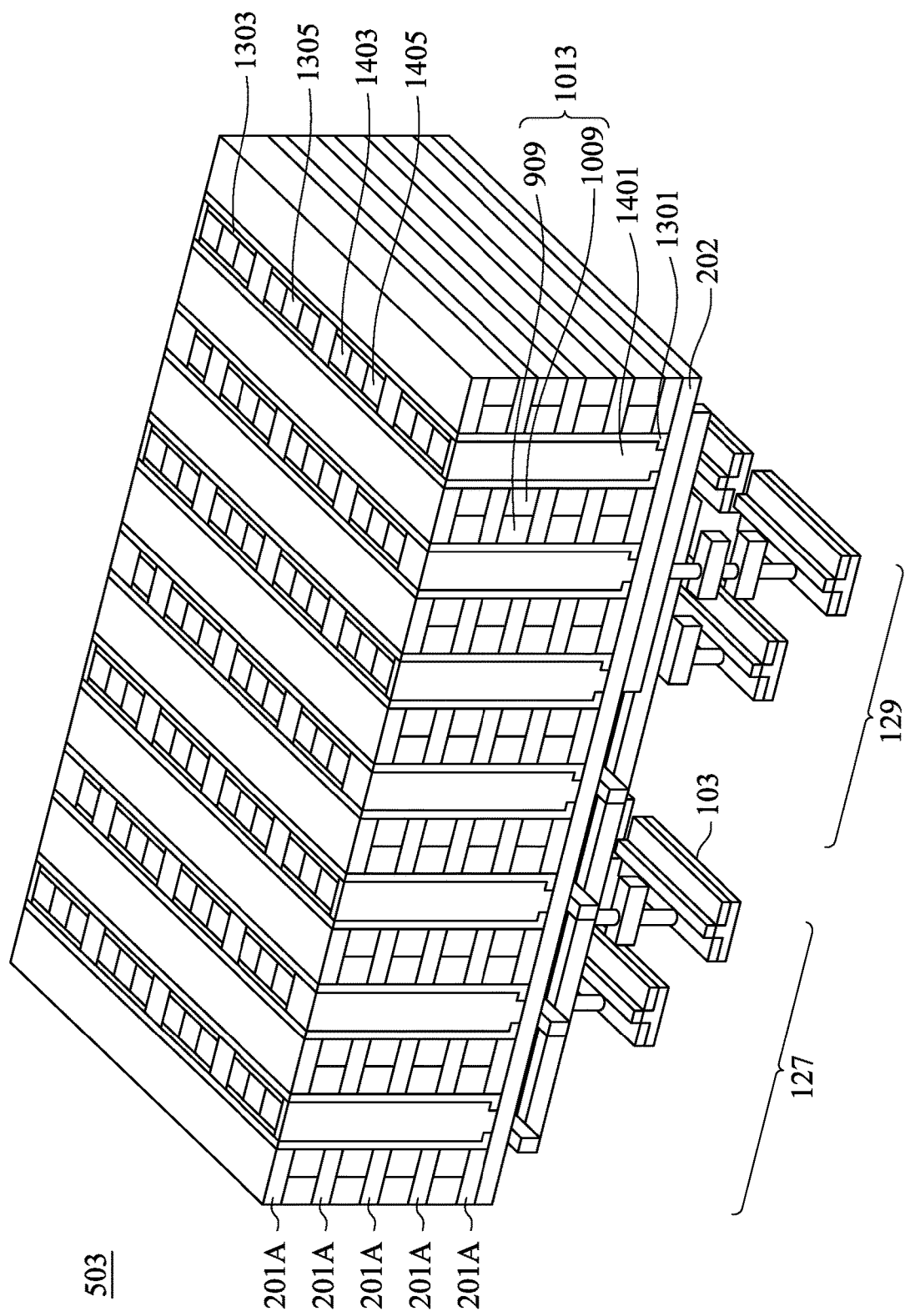
FIGS. 14A-14B illustrate deposition of dielectric plugs, bit lines and source lines, in accordance with some embodiments.
Figure 14B:
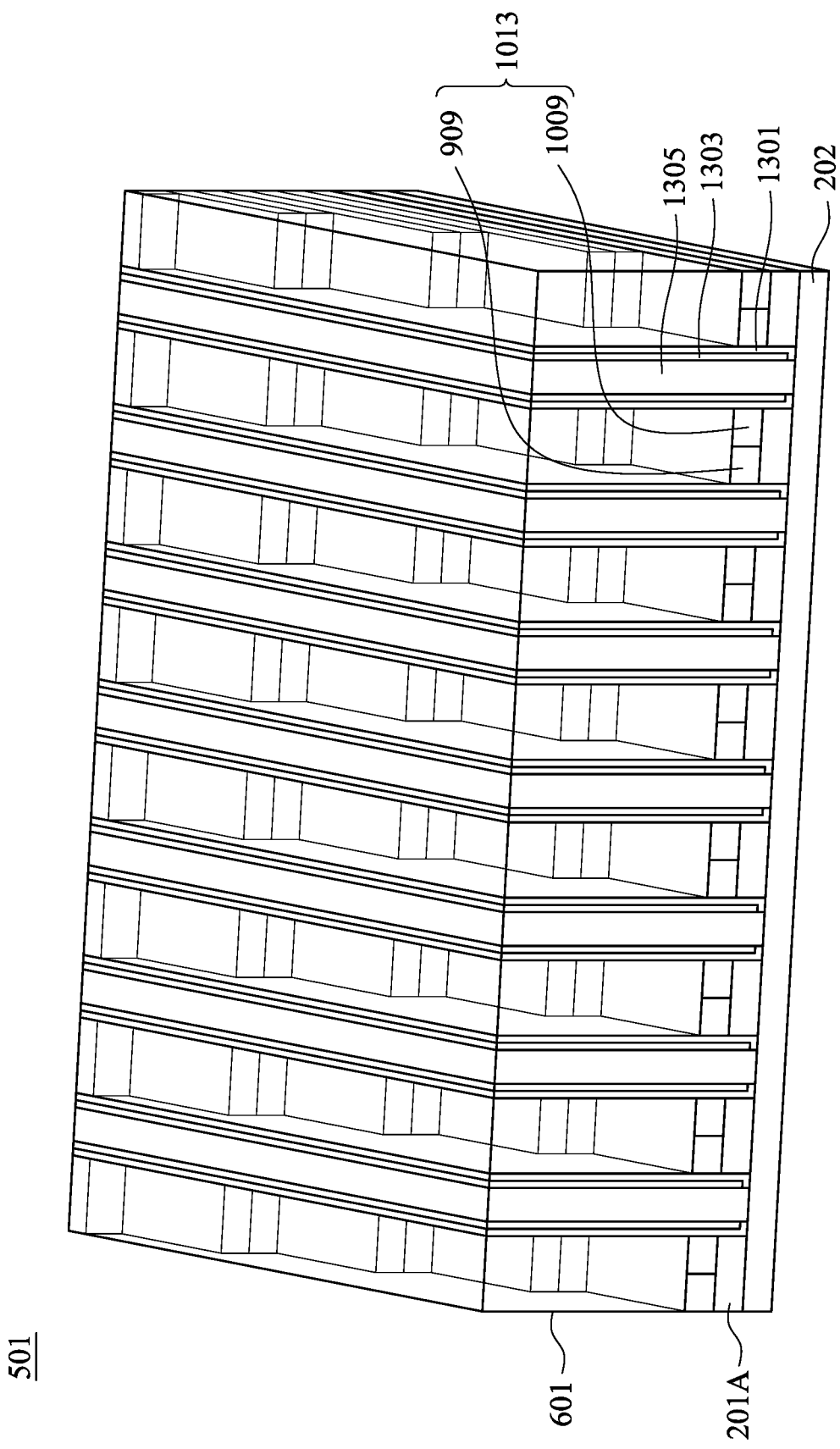

FIGS. 14A-14B (with FIG. 14A illustrating the memory cell region 503 and FIG. 14B illustrating the stairstep region 501) illustrate formation of dielectric plugs 1401 through the dielectric layers 1305 and the semiconductor strips 1303, with the underlying bit line driver region 127 and source line driver region 129 added back into the figures. The dielectric plugs 1401 are isolation columns that will be disposed between adjacent TFTs, and will physically and electrically separate the adjacent TFTs. In the illustrated embodiment, the dielectric plugs 1401 do not extend through the ferroelectric strips 1301. Different regions of the ferroelectric strips 1301 may be independently polarized, and thus the ferroelectric strips 1301 can function to store values even when adjacent regions are not physically and electrically separated. In another embodiment, the dielectric plugs 1401 are also formed through the ferroelectric strips 1301. The dielectric plugs 1401 further extend through the first dielectric layers 201A.

As an example to form the dielectric plugs 1401, openings for the dielectric plugs 1401 can be formed through the dielectric layers 1305 and the semiconductor strips 1303. The openings may be formed using acceptable photolithography and etching techniques. One or more dielectric material(s) are then formed in the openings. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material(s) may be formed by an acceptable deposition process such as ALD, CVD, or the like. In some embodiments, silicon oxide or silicon nitride is deposited in the openings. A planarization process is then applied to the various layers to remove excess dielectric material(s) over the topmost first dielectric layer 201A. The planarization process may be a chemical mechanical polish (CMP), an etch-back process, combinations thereof, or the like. The remaining dielectric material(s) form the dielectric plugs 1401 in the openings.

Once formed, bit lines 1403 and source lines 1405 are formed through the dielectric layers 1305. The bit lines 1403 and the source lines 1405 further extend through the first dielectric layers 201A. The bit lines 1403 and the source lines 1405 act as source/drain regions of the TFTs. The bit lines 1403 and the source lines 1405 are conductive columns that are formed in pairs, with each semiconductor strip 1303 contacting a corresponding bit line 1403 and a corresponding source line 1405. Each TFT comprises a bit line 1403, a source line 1405, a word line 1013 and the regions of the semiconductor strip 1303 and the ferroelectric strip 1301 intersecting the word line 1013. Each dielectric plug 1401 is disposed between a bit line 1403 of a TFT and a source line 1405 of another TFT. In other words, a bit line 1403 and a source line 1405 are disposed at opposing sides of each of the dielectric plugs 1401. Thus, each dielectric plug 1401 physically and electrically separates adjacent TFTs.

As an example to form the bit lines 1403 and the source lines 1405, openings for the bit lines 1403 and the source lines 1405 can be formed through the dielectric layers 1305 and the first hard mask layer 202. The openings may be formed using acceptable photolithography and etching techniques. Specifically, the openings are formed on opposing sides of the dielectric plugs 1401. One or more conductive material(s), e.g., a glue layer and a bulk conductive material, are then formed in the openings. Acceptable conductive materials include metals such as aluminum, titanium, titanium nitride, tantalum nitride, cobalt, silver, gold, copper, nickel, chromium, hafnium, ruthenium, tungsten, platinum, tungsten nitride, combinations of these, or the like. The conductive material(s) may be formed by an acceptable deposition process such as ALD or CVD, an acceptable plating process such as electroplating or electroless plating, or the like. In some embodiments, tungsten is deposited in the openings. A planarization process is then applied to the various layers to remove excess conductive material(s) over the topmost first dielectric layer 201A. The planarization process may be a chemical mechanical polish (CMP), an etch-back process, combinations thereof, or the like. The remaining conductive material(s) form the bit lines 1403 and the source lines 1405 in the openings.

FIG. 14B illustrates that, while the dielectric plugs 1401, the bit line 1403, and the source line 1405 are formed within the memory cell region 503, similar structures are not formed within the stairstep region 501. As such, no change to the structure within the stairstep region 501 is made.

Figure 15A:
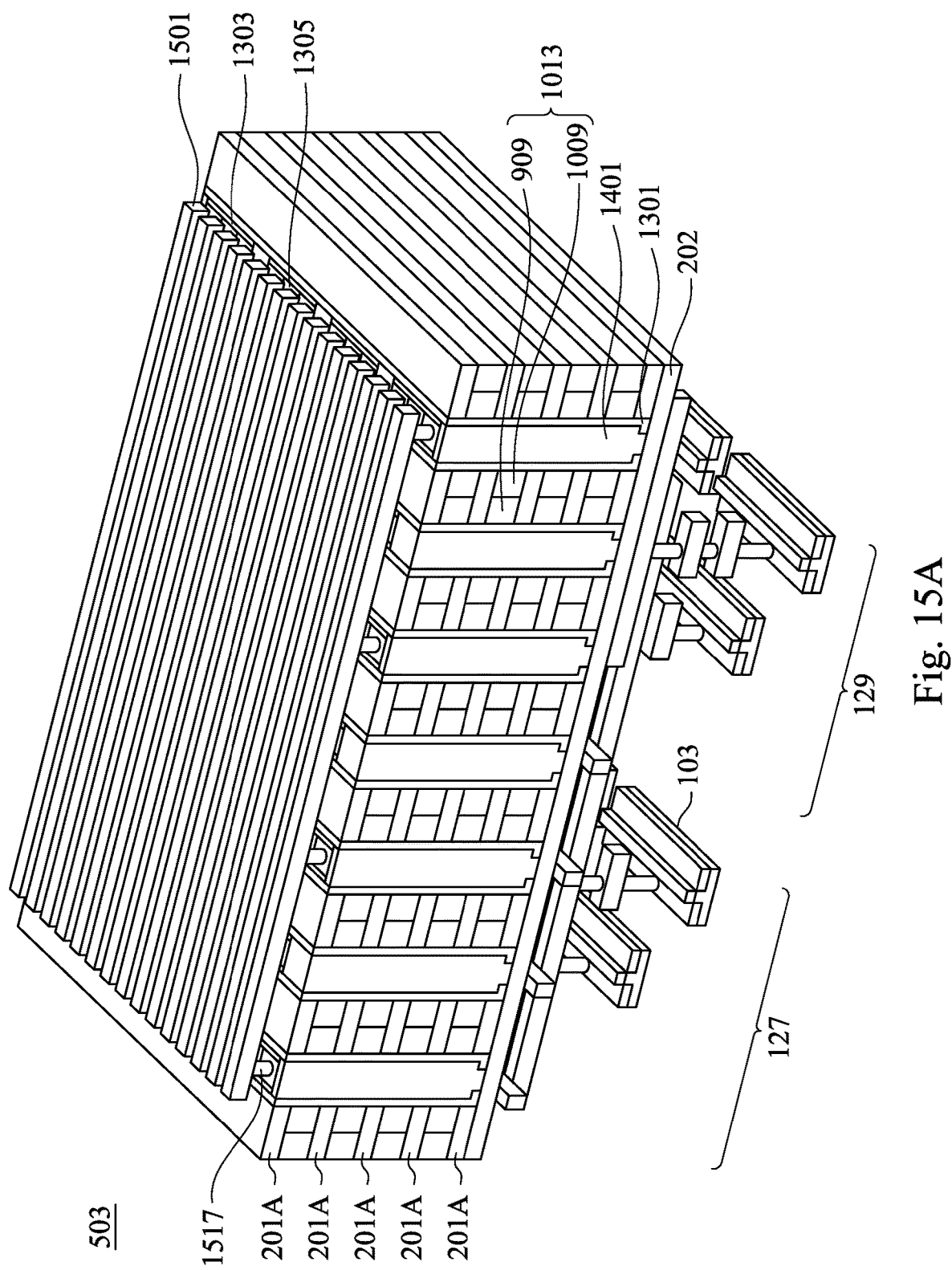
Figure 15B:
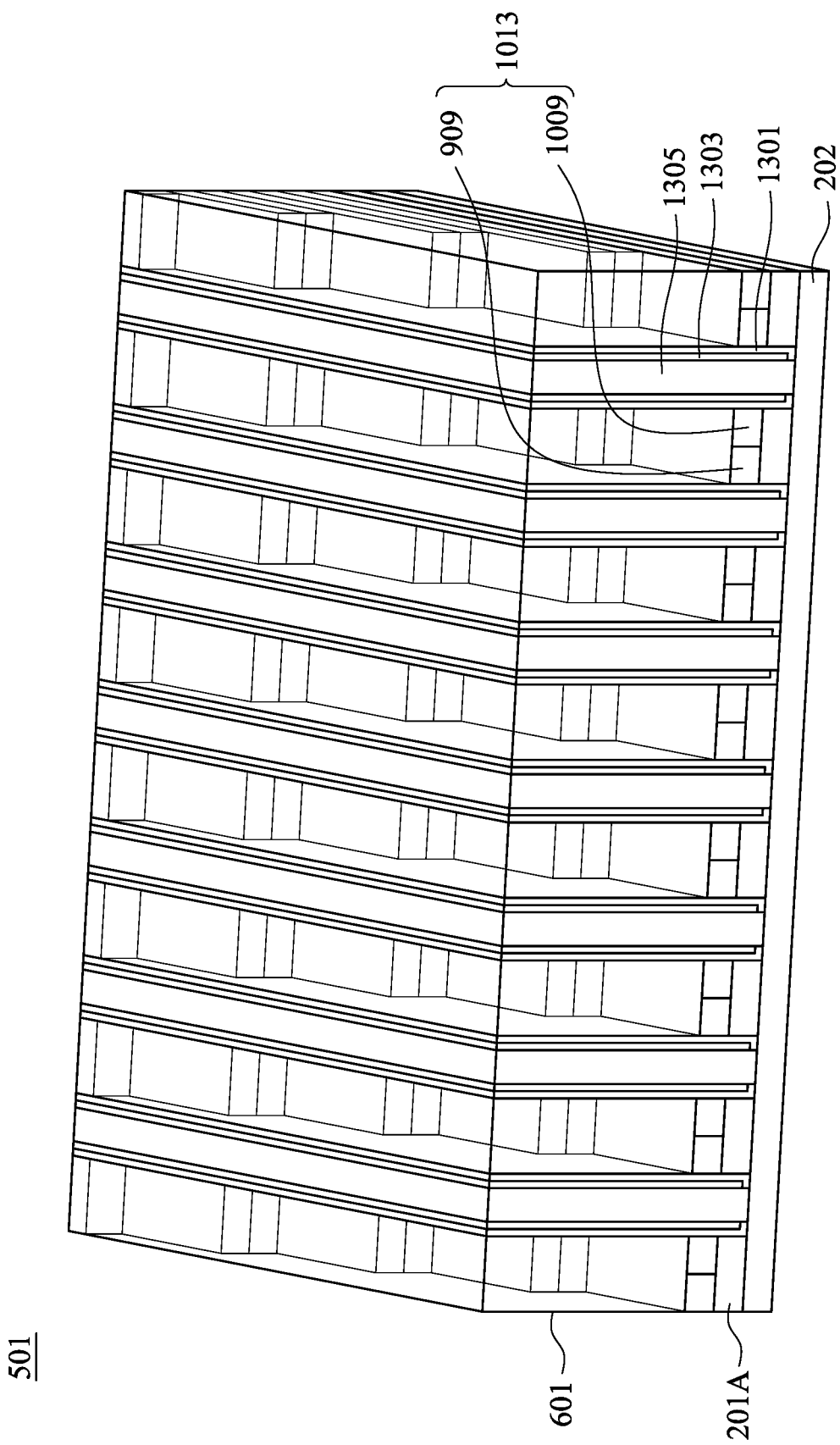

FIGS. 15A-15B (with FIG. 15A illustrating the memory cell region 503 and FIG. 15B illustrating the stairstep region 501) illustrate formation of an interconnect structure 1501 over the topmost first dielectric layer 201A. The interconnect structure 1501 may include, e.g., metallization patterns in a dielectric, wherein only the conductive features of the interconnect structure 1501 are shown in FIG. 15A for clarity. The dielectric material may include one or more dielectric layers, such as one or more layers of a low-k (LK) or an extra low-K (ELK) dielectric material. The metallization patterns may be metal interconnects that include metal lines (discussed further below with respect to FIG. 15C) and conductive vias 1517 formed in the one or more dielectric layers. The interconnect structure 1501 may be formed by a damascene process, such as a single damascene process, a dual damascene process, or the like.

FIG. 15B illustrates that, while the interconnect structure 1501 is formed within the memory cell region 503, similar structures are not formed within the stairstep region 501. As such, no change to the structure within the stairstep region 501 is made.

Figure 15C:
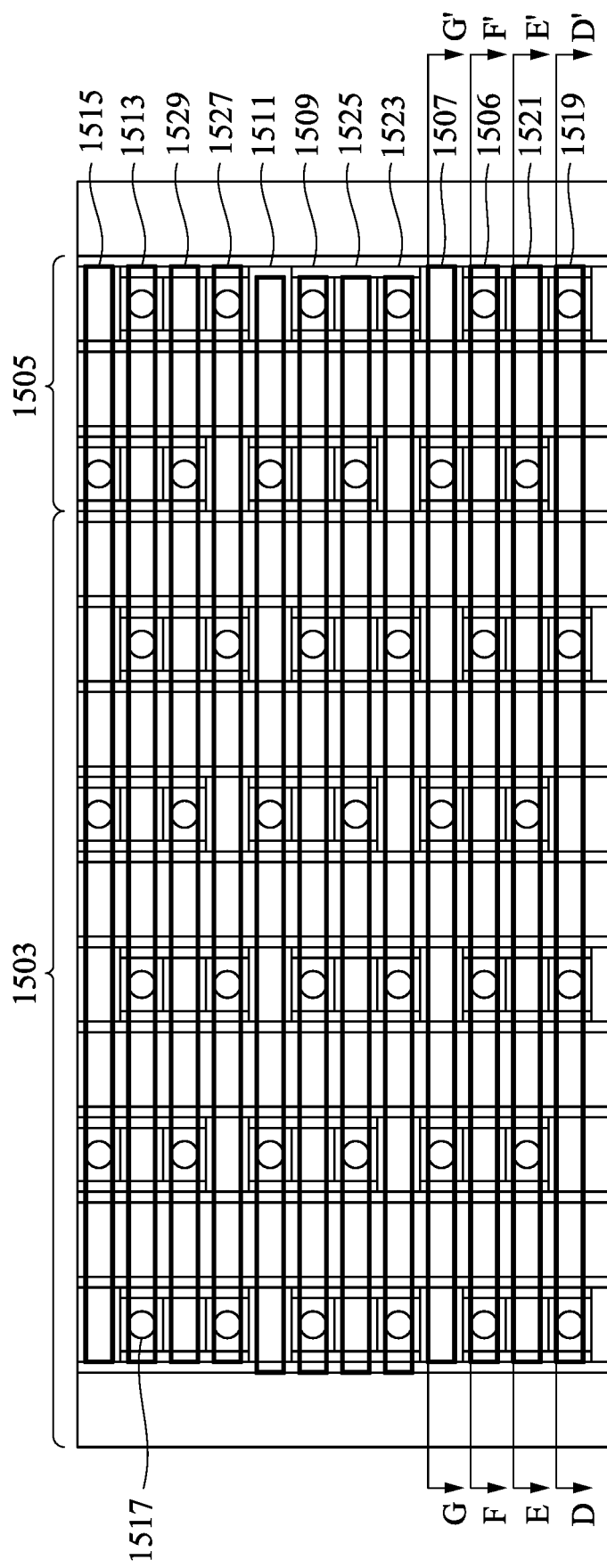

FIG. 15C illustrates a top down view of the interconnect structure 1501 over the memory cell region 503 (wherein the bit lines and source lines are partially transparent for clarity). In some embodiments, and as illustrated, the interconnect structure 1501 and the underlying structure comprise a memory array region 1503 and a connection region 1505 located along an outer edge of the memory array region 1503. In an embodiment the memory array region 1503 comprises an array of the TFTs, wherein each of the TFTs are ferroelectric random access memory (FeRAM) memory cells that are utilized to store data, and the memory array region 1503 additionally comprises portions of the interconnect structure 1501 which are utilized to provide electrical connections to the bit lines 1403 and the source lines 1405 for reading and/or writing to the individual memory cells.

In a particular embodiment, the interconnect structure 1501 comprises a series of bit lines (e.g., a first bit line 1506, a second bit line 1507, a third bit line 1509, a fourth bit line 1511, a fifth bit line 1513, and a sixth bit line 1515) which are formed as conductive lines within the interconnect structure 1501, and also comprises conductive vias 1517 which are utilized to connect individual memory cells with the series of bit lines. Additionally, the interconnect structure 1501 additionally comprises a series of source lines (e.g., a first source line 1519, a second source line 1521, a third source line 1523, a fourth source line 1525, a fifth source line 1527, and a sixth source line 1529) which are also formed as conductive lines within the interconnect structure 1501, and also comprises conductive vias 1517 which are utilized to connect individual memory cells with the series of source lines.

The connection region 1505, however, while comprising identical structures as the memory cell region 503, is utilized in order to provide electrical connection between the memory cells within the memory cell region 503 and the underlying bit line drivers (e.g., within the bit line driver region 127) and source line drivers (e.g., within the source line driver region 129) located under the memory cell region 503 and the connection region 1505. In particular, the connection region 1505, using structures that are identical to the TFTs formed within the memory array region 1503, uses the conductive source lines 1403 and bit lines 1405 to connect the memory cells within the memory cell region 503 to the CMOS devices located under the area design of the memory (e.g., in a CuA configuration).

To provide this connection the bit lines 1403 and the source lines 1405 located within the connection region 1505 are connected to and in physical contact with individual ones of the fifth metal layer 125 (e.g., vias) located within the fifth dielectric layer 123 (see FIGS. 1A-1B). In particular, because the vias within the fifth metal layer 125 are already located in the connection region 1505, when the openings are formed for the bit lines 1403 and the source lines 1405, the vias within the fifth metal layer 125 in the connection region 1505 will also be exposed (although the openings for the bit lines 1403 and the source lines 1405 formed in the memory array region 1503 will expose the fifth dielectric layer 123), and the material of the bit lines 1403 and the source lines 1405 will be deposited in physical contact with the vias within the fifth metal layer 125. As such, the bit lines 1403 and the source lines 1405 located within the connection region 1505 are used as conductive through vias, even though the structure of the bit lines 1403 and the source lines 1405 are identical to the structure of the bit lines 1403 and the source lines 1405 within the memory cell region 503.

By using the bit lines 1403 and the source lines 1405 to provide the connections, identical structures (except for the presence of the fifth metal layer 125) can be utilized to both store data (e.g., with the TFTs located within the memory array region 1503) and also to provide electrical connections through the memory array (e.g., with the same structures located within the connection region 1505). Such identical structures allow for the structures to be formed simultaneously with the same processes, and without the need for a separate process to form the desired connections using, e.g., deep through vias.

Figures 15D, 15E:
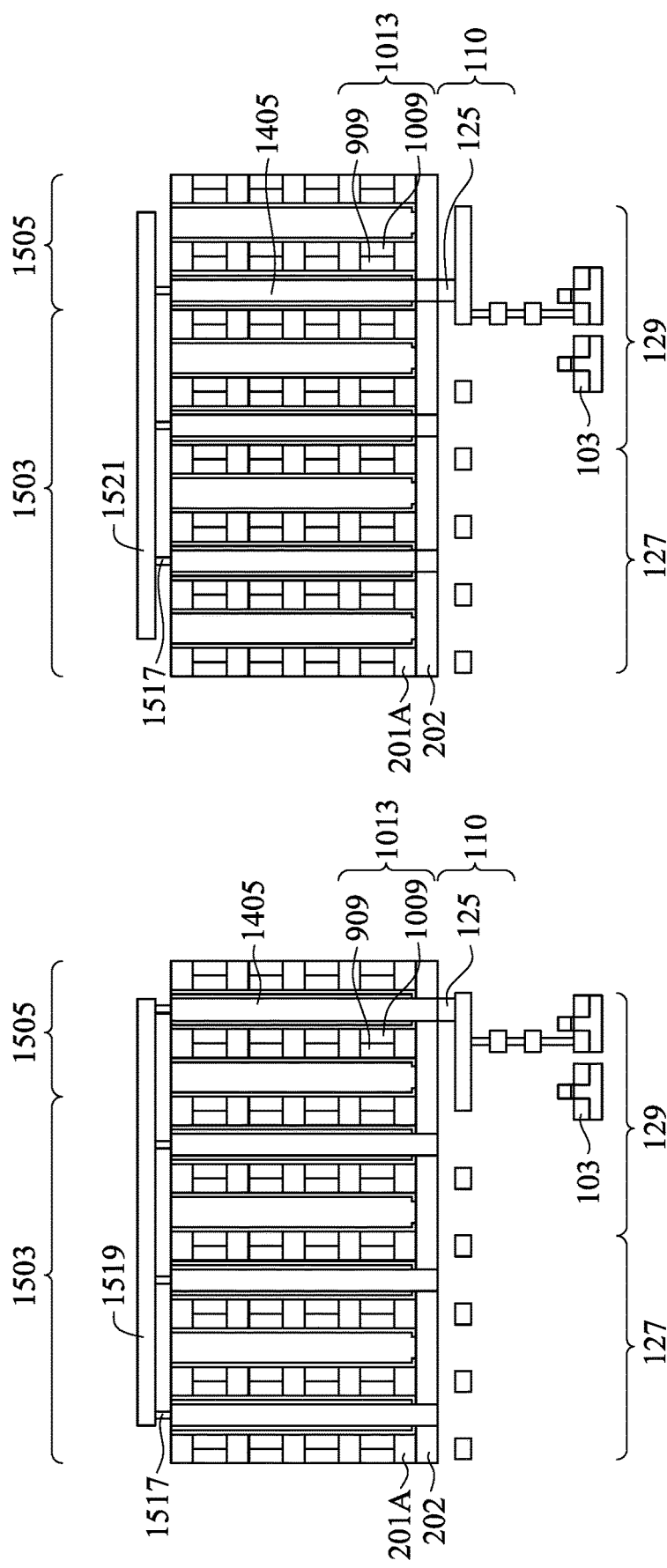

FIG. 15D illustrates a cross-sectional view of the memory array region 1503 and the connection region 1505 along line D-D' in FIG. 15C. As can be seen, the memory cells are connected to the active devices 103 within the source line driver region 129 (e.g., to a source line driver) through a first one of the conductive vias 1517, the first source line 1519, a second one of the conductive vias 1517, a source line 1405 adjacent to the semiconductor strip 1303 within the connection region 1505, the fifth metal layer 125, and a rest of the metallization layers 110.

FIG. 15E illustrates a cross-sectional view of the memory array region 1503 and the connection region 1505 along line E-E' in FIG. 15C. As can be seen, the memory cells are connected to the active devices 103 within the source line driver region 129 (e.g., to a source line driver) through a first one of the conductive vias 1517, the second source line 1521, a second one of the conductive vias 1517, a source line 1405 adjacent to the semiconductor strip 1303 in the connection region 1505, the fifth metal layer 125, and a rest of the metallization layers 110.

FIG. 15F illustrates a cross-sectional view of the memory array region 1503 and the connection region 1505 along line F-F' in FIG. 15C. As can be seen, the memory cells are connected to the active devices 103 within the bit line driver region 127 (e.g., to a bit line driver) through a first one of the conductive vias 1517, the first bit line 1506, a second one of the conductive vias 1517, a bit line 1403 adjacent to the semiconductor strip 1303 in the connection region 1505, the fifth metal layer 125, and a rest of the metallization layers 110.

FIG. 15G illustrates a cross-sectional view of the memory array region 1503 and the connection region 1505 along line G-G' adjacent to the semiconductor strip 1303. As can be seen, the memory cells are connected to the active devices 103 within the bit line driver region 127 (e.g., to a bit line driver) through the a first one of the conductive vias 1517, the second bit line 1507, a second one of the conductive vias 1517, a bit line 1403 adjacent to the semiconductor strip 1303 in the connection region 1505, the fifth metal layer 125, and a rest of the metallization layers 110.

Once the interconnect structure 1501 has been formed to interconnect the memory cells with the drivers, additional processing may be performed. For example, in an embodiment conductive contacts (not separately illustrated) to the individual word lines 1013 located in the stairstep region (see, e.g., FIG. 15B) may be made by forming openings through the IMD 601 and filling those openings with one or more conductive materials. However, any suitable additional processing steps may be utilized.

Figure 16:
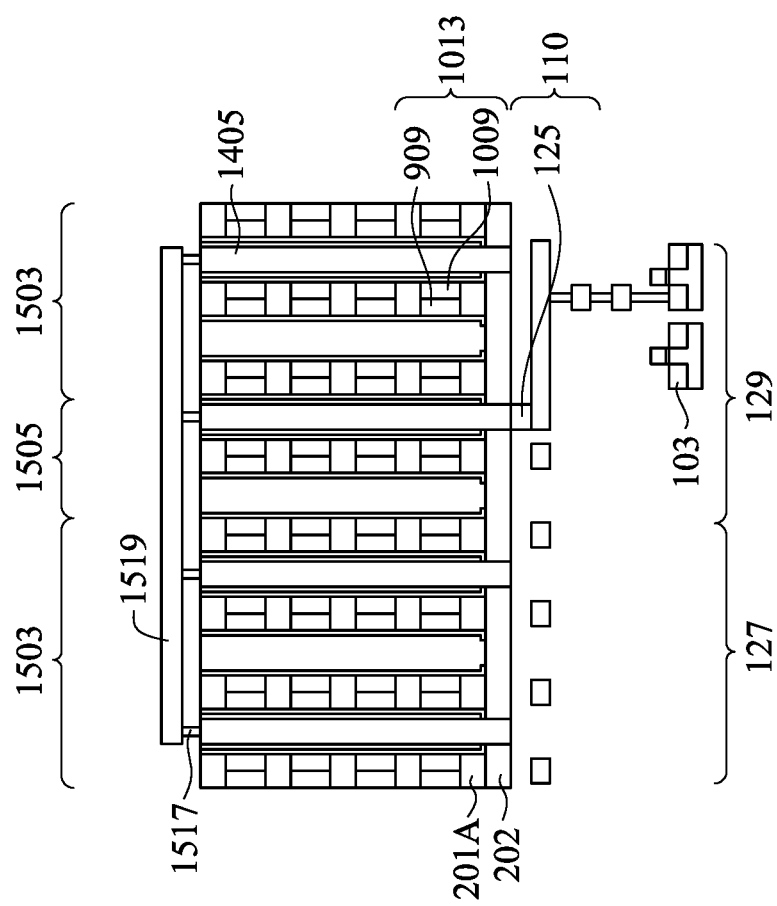
FIG. 16 illustrates an embodiment in which the through vias are located within a center of the memory array, in accordance with some embodiments.

FIG. 16 illustrates another embodiment in which the connection region 1505 is located not at an edge of the memory array region 1503 (as illustrated in FIGS. 15A-15G), but is instead located in a center region of the memory array region 1503. As such, separate portions of the memory array region 1503 are located on multiple sides of the connection region 1505. However, any suitable placement of the connection region 1505 may be utilized simply by moving the location of the fifth metal layer 125.

By utilizing identical structures to form both the TFTs for the memory cells as well as the through vias to connect the TFTs to underlying devices located below the memory array, simultaneous processes may be used to form both the TFTs as well as the electrical connections. By using simultaneous processes, the formation of the memory cells and the through vias share the same photolithographic masks, and the use of additional masks and processes to form the through vias can be avoided, thereby simplifying the overall process and making the overall process cheaper. Additionally, by placing the drivers beneath the memory array instead of placing them on outer edges of the memory array, the footprint of the overall device can be reduced, resulting is a smaller overall device.

In accordance with an embodiment, a method of manufacturing a semiconductor device, the method including: forming a source line driver on a semiconductor substrate; forming a first metallization layer over the source line driver; depositing a multilayer stack directly over the first metallization layer; forming a ferroelectric random access memory cell within the multilayer stack; and forming a through via to the first metallization layer simultaneously with the ferroelectric random access memory cell. In an embodiment the method further includes forming a second metallization layer over the ferroelectric random access memory cell, the second metallization layer electrically connecting the source line driver to the ferroelectric random access memory cell through the through via. In an embodiment the method further includes forming a bit line driver on the semiconductor substrate prior to the forming the first metallization layer. In an embodiment the method further includes forming a second through via to the first metallization layer, the second through via being formed simultaneously with the ferroelectric random access memory cell. In an embodiment after the forming the through via the through via is located adjacent to a semiconductor layer. In an embodiment after the forming the through via the semiconductor layer is adjacent to a ferroelectric layer. In an embodiment the method further includes: forming a dielectric layer over the first metallization layer; and forming a via through the dielectric layer, wherein the ferroelectric random access memory cell is isolated from the first metallization layer by the dielectric layer and the through via is electrically connected to the first metallization layer through the via.

In accordance with another embodiment, a method of manufacturing a semiconductor device, the method includes: depositing a multilayer stack over a semiconductor substrate, wherein an array of active devices are formed directly under the multilayer stack; patterning the multilayer stack to form first openings and second openings, the first openings exposing a dielectric material and the second openings exposing conductive portions of a metallization layer connected to the array of active devices; replacing some layers of the multilayer stack to form word lines; depositing a ferroelectric layer along sidewalls of the first openings and the second openings; depositing a semiconductor layer adjacent to the ferroelectric layer in the first openings and the second openings; and depositing a second dielectric material to fill a remainder of the first openings and the second openings; and planarizing the second dielectric material to the multilayer stack; and forming conductive material extending through the second dielectric material, the conductive material in physical contact with the conductive portions of the metallization layer. In an embodiment the method further includes forming a second metallization layer over the conductive material to electrically connect a first portion of the conductive material within one of the first openings to a second portion of the conductive material within one of the second openings. In an embodiment a first plurality of the array of active devices are part of a bit line driver. In an embodiment a second plurality of the array of active devices are part of a source line driver. In an embodiment the second openings are located along an edge of a memory array. In an embodiment the second openings are located within a memory array. In an embodiment the ferroelectric layer is part of a ferroelectric random access memory cell.

In yet another embodiment, a semiconductor device includes: a bit line driver located over a semiconductor substrate; a first metallization layer over the bit line driver, the first metallization layer comprising a dielectric material; a ferroelectric random access memory array over the first metallization layer, wherein each memory cell within the ferroelectric random access memory array comprises a ferroelectric material, a semiconductor material and a conductive material; and a via electrically connected to the first metallization layer, the via being adjacent to the ferroelectric material and the semiconductor material. In an embodiment the semiconductor device further includes a second metallization layer over the memory cell. In an embodiment the second metallization layer electrically connects the via to a memory cell of the ferroelectric random access memory array. In an embodiment the via is located along an edge of the ferroelectric random access memory array. In an embodiment the via is located in a center of the ferroelectric random access memory array. In an embodiment the bit line driver is located directly under the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a source line driver on a semiconductor substrate;
   forming a first metallization layer over the source line driver;
   depositing a multilayer stack directly over the first metallization layer;
   forming a ferroelectric random access memory cell within the multilayer stack; and
   forming a through via to the first metallization layer simultaneously with the ferroelectric random access memory cell.

2. The method of claim 1, further comprising forming a second metallization layer over the ferroelectric random access memory cell, the second metallization layer electrically connecting the source line driver to the ferroelectric random access memory cell through the through via.

3. The method of claim 1, further comprising forming a bit line driver on the semiconductor substrate prior to the forming the first metallization layer.

4. The method of claim 1, further comprising forming a second through via to the first metallization layer, the second through via being formed simultaneously with the ferroelectric random access memory cell.

5. The method of claim 1, wherein after the forming the through via the through via is located adjacent to a semiconductor layer.

6. The method of claim 5, wherein after the forming the through via the semiconductor layer is adjacent to a ferroelectric layer.

7. The method of claim 1, further comprising:
   forming a dielectric layer over the first metallization layer; and
   forming a via through the dielectric layer, wherein the ferroelectric random access memory cell is isolated from the first metallization layer by the dielectric layer and the through via is electrically connected to the first metallization layer through the via.

8. A method of manufacturing a semiconductor device, the method comprising:
   depositing a multilayer stack over a semiconductor substrate, wherein an array of active devices are formed directly under the multilayer stack;
   patterning the multilayer stack to form first openings and second openings, the first openings exposing a dielectric material and the second openings exposing conductive portions of a metallization layer connected to the array of active devices;
   replacing some layers of the multilayer stack to form word lines;
   depositing a ferroelectric layer along sidewalls of the first openings and the second openings;
   depositing a semiconductor layer adjacent to the ferroelectric layer in the first openings and the second openings;
   depositing a second dielectric material to fill a remainder of the first openings and the second openings;
   planarizing the second dielectric material to the multilayer stack; and
   forming conductive material extending through the second dielectric material, the conductive material in physical contact with the conductive portions of the metallization layer.

9. The method of claim 8, further comprising forming a second metallization layer over the conductive material to electrically connect a first portion of the conductive material within one of the first openings to a second portion of the conductive material within one of the second openings.

10. The method of claim 8, wherein a first plurality of the array of active devices are part of a bit line driver.

11. The method of claim 10, wherein a second plurality of the array of active devices are part of a source line driver.

12. The method of claim 8, wherein the second openings are located along an edge of a memory array.

13. The method of claim 8, wherein the second openings are located within a memory array.

14. The method of claim 8, wherein the ferroelectric layer is part of a ferroelectric random access memory cell.

15. A method of manufacturing a semiconductor device, the method comprising:
- forming a bit line driver located over a semiconductor substrate;
- forming a first metallization layer over the bit line driver, the first metallization layer comprising a dielectric material;
- forming a ferroelectric random access memory array over the first metallization layer, wherein each memory cell within the ferroelectric random access memory array comprises a ferroelectric material, a semiconductor material and a conductive material; and
- forming a via electrically connected to the first metallization layer, the via being adjacent to the ferroelectric material and the semiconductor material.

16. The method of claim 15, further comprising forming a second metallization layer over the memory cell.

17. The method of claim 16, wherein the second metallization layer electrically connects the via to a memory cell of the ferroelectric random access memory array.

18. The method of claim 15, wherein the forming the via forms the via located along an edge of the ferroelectric random access memory array.

19. The method of claim 15, wherein the forming via forms the via in a center of the ferroelectric random access memory array.

20. The method of claim 15, wherein the bit line driver is located directly under the via.

* * * * *